(12) United States Patent
Yoon et al.

(10) Patent No.: US 11,843,062 B2
(45) Date of Patent: Dec. 12, 2023

(54) SOLAR CELL AND SOLAR CELL PANEL INCLUDING THE SAME

(71) Applicant: Shangrao Jinko solar Technology Development Co., LTD, Jiangxi (CN)

(72) Inventors: Philwon Yoon, Seoul (KR); Jaewon Chang, Seoul (KR); Jinsung Kim, Seoul (KR)

(73) Assignee: Shangrao Jinko solar Technology Development Co., Jiangxi (CN)

( * ) Notice: Subject to any disclaimer, the term of this patent is extended or adjusted under 35 U.S.C. 154(b) by 0 days.

(21) Appl. No.: 16/184,355

(22) Filed: Nov. 8, 2018

(65) Prior Publication Data

US 2019/0074391 A1 Mar. 7, 2019

Related U.S. Application Data

(63) Continuation of application No. 15/633,107, filed on Jun. 26, 2017, now abandoned.

(30) Foreign Application Priority Data

Dec. 2, 2016 (KR) .......................... 10-2016-0163559

(51) Int. Cl.
*H01L 31/0224* (2006.01)
*H01L 31/02* (2006.01)
(Continued)

(52) U.S. Cl.
CPC .. *H01L 31/022433* (2013.01); *H01L 31/0201* (2013.01); *H01L 31/022425* (2013.01);
(Continued)

(58) Field of Classification Search
CPC ............... H01L 51/447; H01L 31/0201; H01L 31/022425; H01L 31/022433;
(Continued)

(56) References Cited

U.S. PATENT DOCUMENTS 9,054,238 B1 6/2015 Brainard et al.
2007/0186968 A1* 8/2007 Nakauchi ............ H01L 31/0747
136/244
(Continued)

FOREIGN PATENT DOCUMENTS

DE 202015103803 U1 8/2015
DE 202015106557 U1 1/2016
(Continued)

OTHER PUBLICATIONS

JP2003258277A, Machine Translation, Karakida (Year: 2003).*
(Continued)

*Primary Examiner* — Devina Pillay
(74) *Attorney, Agent, or Firm* — Tucker Ellis

(57) ABSTRACT

Disclosed is a solar cell panel including: a semiconductor substrate having a long axis and a short axis that intersect; a first conductivity type region formed on one surface of the semiconductor substrate; a second conductivity type region formed on the other surface of the semiconductor substrate; a first electrode electrically connected to the first conductivity type region; and a second electrode electrically connected to the second conductivity type region. The first electrode includes: a plurality of finger lines positioned in a first direction parallel to the long axis and being parallel to each other; and a plurality of bus bars including a plurality of pad portions positioned in a second direction parallel to the short axis. The plurality of pad portions include a first outer pad and a second outer pad located on opposite ends of the plurality of bus bars in the second direction, respectively.

16 Claims, 8 Drawing Sheets

(51) Int. Cl.
  *H01L 31/0352* (2006.01)
  *H01L 31/05* (2014.01)
  *H10K 30/87* (2023.01)
  *H01L 31/048* (2014.01)
  *H01L 31/06* (2012.01)

(52) U.S. Cl.
  CPC .. *H01L 31/022441* (2013.01); *H01L 31/0352* (2013.01); *H01L 31/048* (2013.01); *H01L 31/0504* (2013.01); *H01L 31/0508* (2013.01); *H01L 31/06* (2013.01); *H10K 30/87* (2023.02); *Y02E 10/50* (2013.01)

(58) Field of Classification Search
  CPC ......... H01L 31/022441; H01L 31/0352; H01L 31/048; H01L 31/0504; H01L 31/0508; H01L 31/06; Y02E 10/50
  See application file for complete search history.

(56) References Cited

U.S. PATENT DOCUMENTS

| | | | |
|---|---|---|---|
| 2009/0032081 A1* | 2/2009 | Saita | H01L 31/022425 136/244 |
| 2009/0145479 A1 | 6/2009 | Williams | |
| 2012/0138141 A1* | 6/2012 | Kim | H01L 31/022433 136/256 |
| 2012/0318351 A1* | 12/2012 | Pfennig | H01L 31/022433 136/256 |
| 2013/0048047 A1* | 2/2013 | Fujii | H01L 31/0504 136/244 |
| 2013/0167910 A1* | 7/2013 | DeGroot | H01L 31/0504 136/251 |
| 2013/0206221 A1 | 8/2013 | Gannon et al. | |
| 2014/0109962 A1 | 4/2014 | Kobayashi et al. | |
| 2014/0243392 A1 | 8/2014 | Ochiya et al. | |
| 2014/0318613 A1* | 10/2014 | Von Campe | H01L 31/0201 136/256 |
| 2015/0000736 A1 | 1/2015 | Taira et al. | |
| 2015/0090334 A1* | 4/2015 | Han | H01L 31/0201 136/256 |
| 2015/0349173 A1* | 12/2015 | Morad | H01L 31/05 438/67 |
| 2016/0005905 A1* | 1/2016 | Jang | H01L 31/022433 136/244 |
| 2016/0093752 A1 | 3/2016 | Kim et al. | |
| 2016/0172510 A1 | 6/2016 | Bitnar | |
| 2017/0243992 A1* | 8/2017 | Rostan | H01L 31/022433 |
| 2017/0373204 A1* | 12/2017 | Corneille | H01L 31/0512 |
| 2018/0090633 A1* | 3/2018 | Cho | H01L 31/0465 |

FOREIGN PATENT DOCUMENTS

| | | | |
|---|---|---|---|
| JP | 2003258277 A | * | 9/2003 |
| JP | 2008235795 | | 10/2008 |
| JP | 2011-507275 A | | 3/2011 |
| JP | 2014-33240 | | 2/2014 |
| JP | 2014033240 | | 2/2014 |
| JP | 5714080 | | 5/2015 |
| JP | 2016-72637 A | | 5/2016 |
| JP | 2016072637 | | 5/2016 |
| JP | 2016-146373 A | | 8/2016 |
| JP | 2016146373 | | 8/2016 |
| KR | 10-2016-0129670 A | | 11/2016 |

OTHER PUBLICATIONS

Lenaga, JP2008-235795A, Machine Translation, Oct. 2008 (year: 2008).
U.S. Office Action in U.S. Appl. No. 15/633,107, dated Jan. 23, 2019, 14 pages.
U.S. Office Action in U.S. Appl. No. 15/633,107, dated Aug. 28, 2018, 15 pages.
United States Office Action in U.S. Appl. No. 15/633,107, dated Aug. 9, 2019, 12 pages.
Chinese Office Action in Chinese Application No. 201710790576.6, dated Nov. 14, 2019, 16 pages (with English translation).
United States Office Action in U.S. Appl. No. 15/633,107, dated Aug. 8, 2018, 18 pages.
United States Final Office Action in U.S. Appl. No. 15/633,107, dated Jan. 29, 2020, 17 pages.

\* cited by examiner

SOLAR CELL AND SOLAR CELL PANEL INCLUDING THE SAME

CROSS-REFERENCE TO RELATED APPLICATION

This application is a continuation of U.S. application Ser. No. 15/633,107, filed on Jun. 26, 2017, which claims the priority benefit of Korean Patent Application No. 10-2016-0163559 filed on Dec. 2, 2016, the disclosures of which are incorporated herein by reference.

BACKGROUND OF THE INVENTION

1. Field of the Invention

Embodiments of the invention relate to a solar cell and a solar cell panel including the same, and, more particularly, to a solar cell improved in structure and a solar cell panel including the same.

2. Description of the Related Art

Recently, as existing energy resources such as petroleum and coal are expected to be depleted, interest in alternative energy to replace them is increasing. Among them, solar cells are attracting attention as a next-generation battery that converts solar energy into electric energy.

A plurality of solar cells are connected in series or in parallel by a ribbon, and are then packaged through a packaging process for protecting the plurality of solar cells, thereby forming a solar cell panel. Solar cell panels require long-term reliability because they must generate electricity for a longtime in various environments. Generally, a plurality of solar cells are connected by a ribbon.

However, when a solar cell is connected using a ribbon having a large width of about 1.5 mm, a number of ribbons disposed in the solar cell should be reduced because light loss may occur due to a large width of the ribbon. On the other hand, if a number of the ribbons is increased in order to reduce a movement distance of carriers, a resistance is lowered, but an output may be largely lowered due to the shading loss.

SUMMARY OF THE INVENTION

Therefore, embodiments of the invention have been made in view of the above problems, and the invention is to provide a solar cell and a solar cell panel being capable of improving an output of a solar cell panel.

A solar cell according to an embodiment includes: a semiconductor substrate having a long axis and a short axis that intersect; a first conductivity type region formed on one surface of the semiconductor substrate; a second conductivity type region formed on the other surface of the semiconductor substrate; a first electrode electrically connected to the first conductivity type region; and a second electrode electrically connected to the second conductivity type region. The first electrode includes: a plurality of finger lines positioned in a first direction parallel to the long axis and being parallel to each other; and a plurality of bus bars including a plurality of pad portions and positioned in a second direction parallel to the short axis. The plurality of pad portions include a first outer pad and a second outer pad located on opposite ends of the plurality of bus bars in the second direction, respectively.

A solar cell panel according to a solar cell panel includes: a plurality of solar cells including a first solar cell and a second solar cell; and a plurality of leads connecting the first solar cell and the second solar cell and having a rounded portion. Each of the plurality of solar cells includes: a semiconductor substrate having a long axis and a short axis that intersect; a first conductivity type region formed on one surface of the semiconductor substrate; a second conductivity type region formed on the other surface of the semiconductor substrate; a first electrode electrically connected to the first conductivity type region; and a second electrode electrically connected to the second conductivity type region. The first electrode includes: a plurality of finger lines positioned in a first direction parallel to the long axis and being parallel to each other; and a plurality of bus bars including a plurality of pad portions and positioned in a second direction parallel to the short axis. The plurality of pad portions include a first outer pad and a second outer pad located on opposite ends of the plurality of plurality of bus bars in the second direction, respectively. The plurality of leads extend along the second direction.

According to the embodiments, light loss can be minimized by using a bus bar having a small width and/or a lead having a wire shape, and a movement path of carriers can be reduced by increasing a number of bus bars and/or leads. Thus, efficiency of the solar cell and an output of the solar cell panel can be improved. Further, the light loss can be minimized due to diffused reflection or the like by using the lead having the wire shape, and the movement path of carriers can be reduced by reducing a pitch of the leads. Thus, the efficiency of the solar cell and the output of the solar cell panel can be improved.

Particularly, the efficiency of the solar cell and the output of the solar cell panel can be maximized by applying the lead to the solar cell having a long axis and a short axis. In this instance, the lead may be arranged in a direction of the short axis and the outer pads may be positioned at both sides in the short axis direction. Then, the movement path through the lead can be minimized and the attachment property of the lead can be enhanced.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF THE EMBODIMENTS

Figure 1:
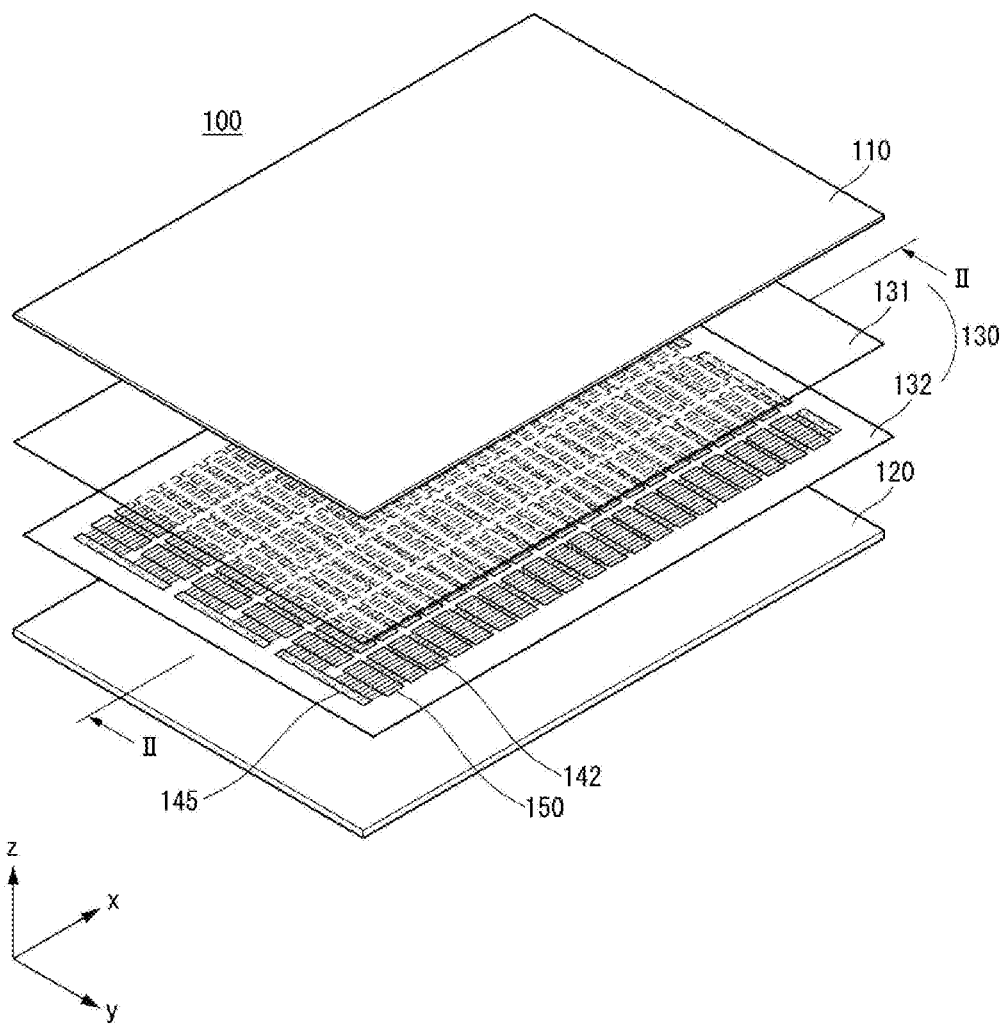
FIG. 1 is a perspective view of a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, the thicknesses, widths or the like of elements are exaggerated or reduced for clarity of description, and should not be construed as limited to those illustrated in the drawings.

It will be understood that the terms "comprises" and/or "comprising," or "includes" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell and a solar cell panel according to an embodiment of the invention will be described in detail with reference to the accompanying drawings.

Figure 2:
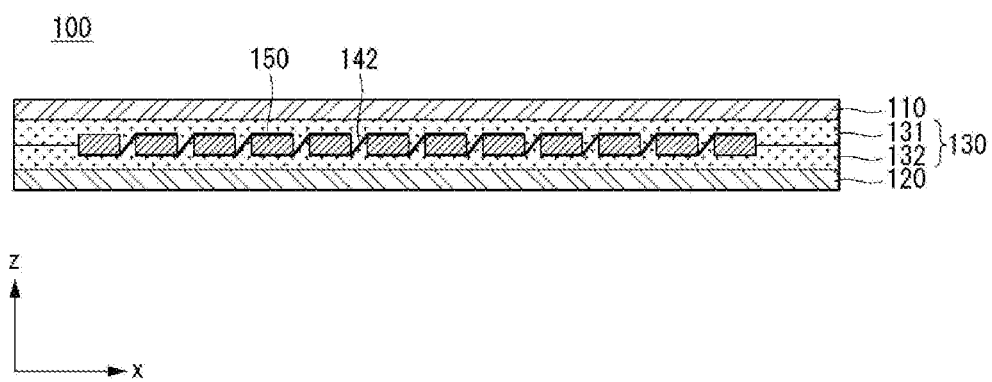
FIG. 2 is a schematic cross-sectional view taken along line II-II in FIG. 1.

FIG. 1 is a perspective view of a solar cell panel according to an embodiment of the invention, and FIG. 2 is a schematic cross-sectional view taken along line II-II in FIG. 1.

Referring to FIGS. 1 and 2, a solar cell panel 100 according to an embodiment includes a plurality of solar cells 150 and leads 142 electrically connecting the plurality of solar cells 150. The solar cell panel 100 includes a sealing member 130 that surrounds and seals the plurality of solar cells 150 and the leads 142 connecting the plurality of solar cells 150, a front substrate 110 positioned at a front surface of the solar cell 150 on the sealing member 130, and a back substrate 120 positioned at a back surface of the solar cell 150 on the sealing member 130. This will be explained in more detail.

First, the solar cell 150 may include a photoelectric conversion unit that converts solar energy into electric energy, and an electrode electrically connected to the photoelectric conversion unit and collects and delivers current. The plurality of solar cells 150 may be electrically connected in series, parallel, or series-parallel by the lead 142. Specifically, the lead 142 electrically connects two neighboring solar cells 150 among the plurality of solar cells 150.

Bus ribbons 145 connect opposite ends of the leads 142 in solar cell strings, each of which is a column of the plurality of solar cells 150 connected through the leads 142, in an alternating manner. The bus ribbons 145 may be arranged at opposite ends of the solar cell strings, to extend in a direction crossing the solar cell strings. The bus ribbons 145 may connect adjacent ones of the solar cell strings, or connect the solar cell strings to a junction box for preventing reversal of current. The material, shape, and connecting structure of the bus ribbons 145 may be varied and thus the embodiments of the invention are not limited thereto.

The sealing member 130 may include a first sealing member 131 disposed at the front surface of the solar cells 150 connected to each other by the leads 142, and a second sealing member 132 disposed at the back surface of the solar cells 150. The first sealing member 131 and the second sealing member 132 block permeation of moisture or oxygen, and chemically combine elements constituting the solar cell panel 100. For the first sealing member 131 and the second sealing member 132, an insulating material having transparent property and adhesive property may be used. As an example, ethylene vinyl acetate (EVA) copolymer resin, polyvinyl butyral, silicone resin, ester-based resin, olefin-based resin, or the like may be used for the first sealing member 131 and the second sealing member 132. The back substrate 120, the second sealing member 132, the solar cells 150, the first sealing member 131, the front substrate 110 or so on may have an integrated structure to form the solar cell panel 100 through a lamination process using the first sealing member 131 and the second sealing member 132.

The front substrate 110 is disposed on the first sealing member 131 and constitutes a front surface of the solar cell panel 100. The back substrate 120 is disposed on the second sealing member 132 and constitutes a back surface of the solar cell panel 100. The front substrate 110 and the back substrate 120 may be made of an insulating material capable of protecting the solar cells 150 from external impact, moisture, ultraviolet, or so on. Also, the front substrate 110 may be made of an optically-transparent material that light can be transmitted through. The back substrate 120 may be a sheet or a film made of an optically-transparent material, a non-optically-transparent material, a reflective material, or the like. For example, the front substrate 110 may be a glass substrate and the back substrate 120 may be a sheet or a film. The back substrate 120 may have a Tedlar/PET/Tedlar (TPT) type or may have a structure in which a layer of polyvinylidene fluoride (PVDF) resin or the like is formed on at least one surface of a base film (e.g., polyethylene terephthalate (PET)).

However, the embodiments of the invention are not limited thereto. Thus, the first sealing member 131 and the second sealing member 132, the front substrate 110, or the back substrate 120 may be made of any of various materials other than the above materials and may have any of various structures other than the above structures. For example, the front substrate 110 or the back substrate 120 may have various structures (e.g., a substrate, a film, a sheet, or so on) or various materials.

Figure 3:
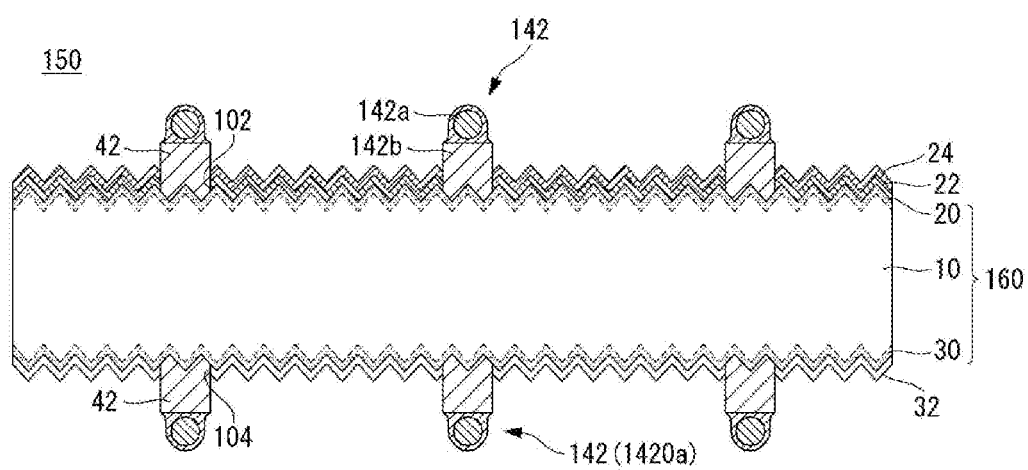
FIG. 3 is a partial cross-sectional view of an example of a solar cell and leads connected thereto, which are included in the solar cell panel shown in FIG. 1.

Referring to FIG. 3, an example of the solar cell 150 and the leads 142 included in the solar cell panel 100 according to the embodiment of the invention will be described in more detail.

FIG. 3 is a partial cross-sectional view of an example of the solar cell 150 and the leads 142 connected thereto, which are included in the solar cell panel 100 shown in FIG. 1.

Referring to FIG. 3, the solar cell 150 includes a semiconductor substrate 160, a first conductivity type region 20 formed on or formed at one surface of the semiconductor substrate 160, a second conductivity type region 30 formed on or formed at the other surface of the substrate 160, a first electrode 42 connected to the first conductivity type region 20, and a second electrode 44 connected to the second conductivity type region 30. Also, the solar cell may further include first and second passivation layers 22 and 32, an anti-reflection layer 24, and the like.

The semiconductor substrate 160 may include a base region 10 having a first or second conductivity type. The base region 10 includes a first or second conductivity type dopant with a relatively low doping concentration. As an example, the base region 10 may have a second conductivity type. The base region 10 may be comprised of a single crystalline semiconductor (e.g., a single-crystalline or polycrystalline semiconductor of a single material, e.g., single-crystalline or polycrystalline silicon, particularly, single-crystalline silicon) including a first or second conductivity type dopant. The solar cell 150 based on the base region 10 or the semiconductor substrate 160 having a high degree of crystallinity and having few defects is excellent in electrical characteristics.

An anti-reflection structure capable of minimizing reflection may be formed at the front surface and the back surface of the semiconductor substrate 160. For example, a texturing structure having a concavo-convex shape in the form of a pyramid or the like may be provided as the anti-reflection structure. The texturing structure formed at the semiconductor substrate 160 may have a certain shape (e.g., a pyramid shape) having an outer surface formed along a specific crystal plane (e.g., (111) plane) of the semiconductor. When the surface roughness of the semiconductor substrate 160 is increased due to the unevenness formed at the front surface of the semiconductor substrate 160 by such texturing, the reflectance of the light incident into the semiconductor substrate 160 can be reduced to minimize the optical loss. However, the embodiments of the invention are not limited thereto, and the texturing structure may be formed at only one surface of the semiconductor substrate 160, or the texturing structure may not be formed at the front and back sides of the semiconductor substrate 160.

The first conductivity type region 20 having the first conductivity type may be formed at one surface (e.g., the front surface) of the semiconductor substrate 160. The second conductivity type region 30 having the second conductivity type may be formed at the other surface (e.g., the back surface) of the semiconductor substrate 160. The first and second conductivity type regions 20 and 30 may have a different conductivity type than the base region 10 or may have a higher doping concentration than the base region 10 in the instance that the first or second conductivity type regions 20 and 30 has the conductivity type the same as the conductivity type of the base region 10.

In the drawing, the first and second conductivity type regions 20 and 30 are constituted by a doped region constituting a part of the semiconductor substrate 160 as an example. In this instance, the first conductivity type region 20 may be composed of a crystalline semiconductor (e.g., a single-crystalline or polycrystalline semiconductor, for example, a single-crystalline or polycrystalline silicon, particularly, a single-crystalline silicon) including the first conductive type dopant. The second conductivity type region may be composed of a crystalline semiconductor (e.g., a single-crystalline or polycrystalline semiconductor, for example, a single-crystalline or polycrystalline silicon, particularly, a single-crystalline silicon) including the second conductivity type dopant. As described above, when the first and second conductivity type regions 20 and 30 constitute apart of the semiconductor substrate 160, the junction characteristics with the base region 10 can be improved.

However, the embodiments of the invention are not limited thereto, and at least one of the first and second conductivity type regions 20 and 30 may be formed separately from the semiconductor substrate 160 on the semiconductor substrate 160. In this instance, the first or second conductivity type regions 20 or 30 may be formed of a semiconductor layer (e.g., an amorphous semiconductor layer, a micro-crystalline semiconductor layer, or a polycrystalline semiconductor layer, for example, an amorphous silicon layer, a micro-crystalline silicon layer, or a polycrystalline silicon layer) having a crystal structure different from that of the semiconductor substrate 160 so that the first or second conductivity type regions 20 or 30 can be easily formed on the semiconductor substrate 160.

One of the first and second conductivity type regions 20 and 30, which has a conductivity type different from that of the base region 10, constitutes at least a part of the emitter region. The emitter region forms a pn junction with the base region 10 to produce a carrier by photoelectric conversion. The other of the first and second conductivity type regions 20 and 30 having the same conductivity type as the base region 10 constitutes at least a part of a surface field region. The surface field region forms an electric field that prevents or reduces carriers from being lost by recombination on the surface of the semiconductor substrate 160. For example, in the embodiment, the base region 10 has the second conductivity type, the first conductivity type region 20 constitutes the emitter region, and the second conductivity type region 30 constitutes a back surface field region. However, the embodiments of the invention are not limited thereto.

In the drawings, each of the first and second conductivity type regions 20 and 30 is formed at an entire portion in a plan view and has a homogeneous structure having a uniform doping concentration. In this instance, the first and second conductivity type regions 20 and 30 can be formed to have a sufficient area and can be manufactured by a simple process. However, the embodiments of the invention are not limited thereto. Thus, the first conductivity type region 20 may have the homogeneous structure or a selective structure, and the second conductivity type region 30 may have the homogeneous structure, a selective structure, or a local structure. In the selective structure, a portion of the first or second conductivity type region 20 or 30 adjacent to the first or second electrode 42 or 44 has a high doping concentration, a large junction depth, and/or a low resistance, and the other portion of the first or second conductivity type region 20 or 30 has a low doping concentration, a small junction depth, and/or high resistance. In the local structure, the second conductivity type region 30 may be formed locally only at a portion where the second electrode 44 is located.

For example, in the embodiment, the base region 10 and the second conductivity type region 30 may have an n-type and the first conductivity type region 20 may have a p-type. Then, the base region 10 and the first conductivity type region 20 form a pn junction. When light is incident to the pn junction, electrons generated by the photoelectric effect move toward the back surface of the semiconductor substrate 160 and are collected by the second electrode 44, and the holes move toward the front surface of the semiconductor substrate 160 and collected by the first electrode 42. Thereby, electric energy is generated. Then, the holes having a low moving speed than electrons may move to the front surface of the semiconductor substrate 160 not the back surface thereof, thereby improving the efficiency. However, the embodiments of the invention are not limited thereto. Thus, the base region 10 and the second conductivity type region 30 may have a p-type and the first conductivity type region 20 may have an n-type.

An insulating layer such as the first and second passivation layers 22 and 32 and the anti-reflection layer 24 may be formed on the surface of the semiconductor substrate 160. More specifically, a first passivation layer 22 may be formed on (e.g., be in contact with) the front surface of the semiconductor substrate 160, more particularly, on the first conductivity type region 20 formed at the semiconductor substrate 160. The anti-reflection layer 24 may be formed on (e.g., be in contact with) the first passivation layer 22. The second passivation layer 32 may be formed on the back surface of the semiconductor substrate 160, more particularly, on the second conductivity type region 30 formed at the semiconductor substrate 160.

The first passivation layer 22 and the anti-reflection layer 24 may be formed on a substantially entire portion of the front surface of the semiconductor substrate 160 except for the portion corresponding to the first electrode 42 (more particularly, the portion where a first opening portion 102 is formed). Similarly, the second passivation layer 32 may be formed on a substantially entire portion of the back surface of the semiconductor substrate 160 except the portion corresponding to the second electrode 44 (more particularly, the portion where a second opening 104 is formed).

The first passivation layer 22 or the second passivation layer 32 is in contact with the semiconductor substrate 160 to passivate the defects existing in the surface or a bulk of the semiconductor substrate 160. Accordingly, the open-circuit voltage of the solar cell 150 can be increased by removing recombination sites of the minority carriers. The anti-reflection layer 24 reduces the reflectance of light incident to the front surface of the semiconductor substrate 160, thereby increasing the amount of light reaching the pn junction. Accordingly, the short circuit current Isc of the solar cell 150 can be increased.

The first passivation layer 22, the anti-reflection layer 24, and the second passivation layer 32 may be formed of any of various materials. For example, the first passivation layer 22, the anti-reflection layer 24, or the second passivation layer 32 may be formed of a single layer including one layer selected from a group consisting of a silicon nitride layer, a silicon nitride layer containing hydrogen, a silicon oxide layer, a silicon oxynitride layer, an aluminum oxide layer, a silicon carbide layer, $MgF_2$, $ZnS$, $TiO_2$ and $CeO_2$, or a multilayer in which two or more layers selected from the above group are combined.

For example, in the embodiment, the first passivation layer 22 and/or the anti-reflection layer 24, and the second passivation layer 32 may not have a dopant or the like so as to have good insulating properties, passivation properties, and the like. However, the embodiments of the invention are not limited thereto.

The first electrode 42 may be formed by filling at least a portion of the first opening 102 and be electrically connected to (e.g., be in contact with) the first conductivity type region 20. The second electrode 44 may be formed by filling at least a portion of the second opening 104 and be electrically connected to (e.g., be in contact with) the second conductivity type region 30. The first and second electrodes 42 and 44 are made of various conductive materials (e.g., a metal) and may have various shapes. The shape of the first and second electrodes 42 and 44 will be described later.

As described above, in the embodiment, the first and second electrodes 42 and 44 of the solar cell 150 have a predetermined pattern so that the solar cell 150 can receive light from the front and back surfaces of the semiconductor substrate 160, and thus, the solar cell 150 has a bi-facial structure. Accordingly, the amount of light used in the solar cell 150 can be increased and thus it contributes to improving the efficiency of the solar cell 150.

However, the embodiments of the invention are not limited thereto, and the second electrode 44 may be formed entirely on the back surface of the semiconductor substrate 160. The first and second conductivity type regions 20 and 30 and the first and second electrodes 42 and 44 may be located together on one surface (e.g., the back surface) of the semiconductor substrate 160. Also, at least one of the first and second conductivity type regions 20 and 30 may be formed on both sides of the semiconductor substrate 160. That is, the solar cell 150 described in the above is merely one example, but the embodiments of the invention are not limited thereto.

The solar cells 150 connected by the leads 142 may include a first solar cell 151 and/or a second solar cell 152, which are unit solar cells manufactured by cutting a mother solar cell 150a and having a long axis (or a major axis) in a length direction (or first direction) and a short axis (or a minor axis) in a width direction (or second direction), where the long axis and the short axis cross each other or intersect. Hereinafter, the mother solar cell 150a including the plurality of solar cells 150 will be described with reference to FIG. 4 together with FIGS. 1 to 3, and the first and second solar cells 151 and 152 manufactured by cutting the mother solar cell 150a will be described in detail with reference to FIG. 5.

Figure 4:
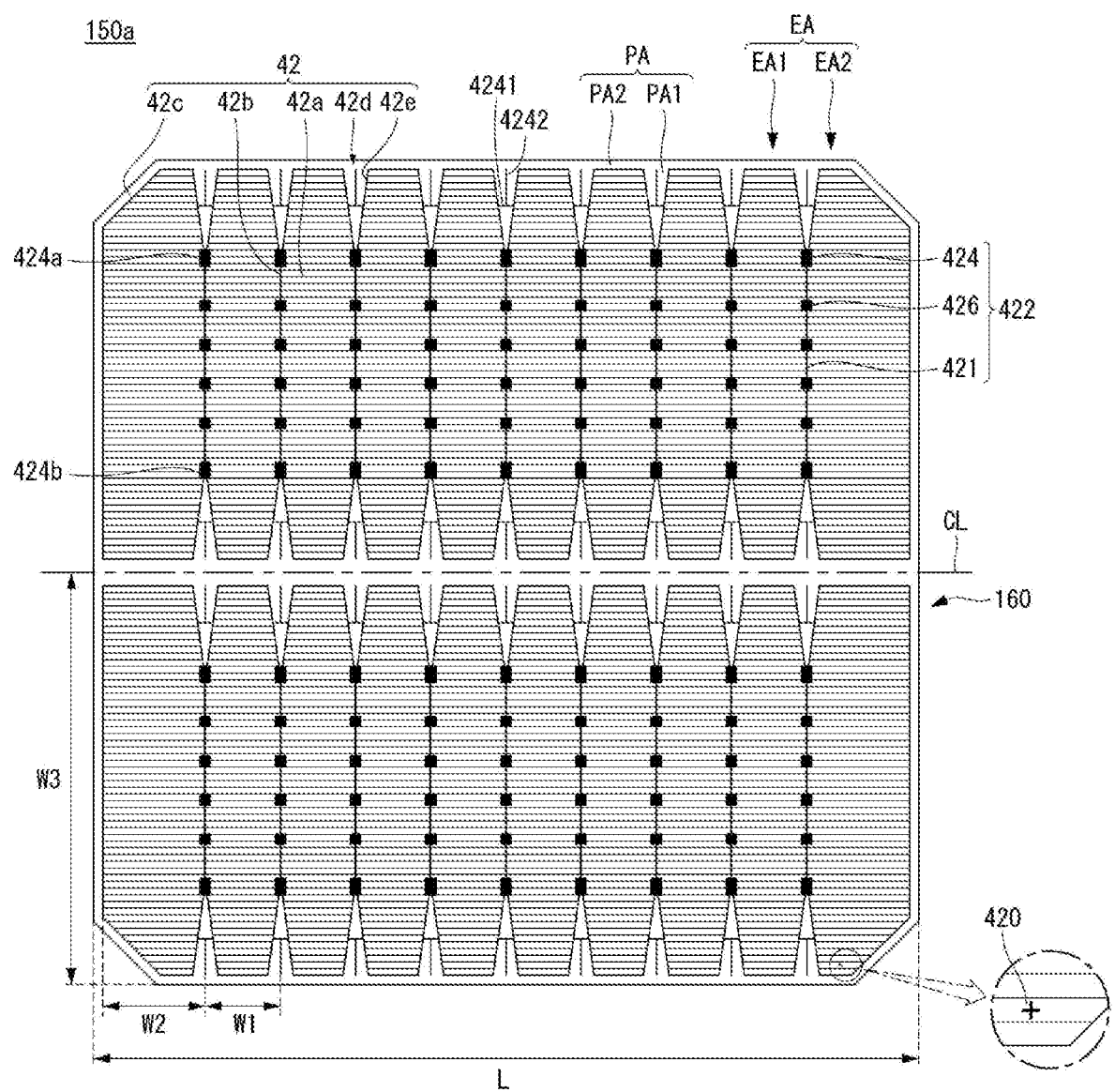
FIG. 4 is a front plan view schematically showing a mother solar cell including a plurality of solar cells applicable to the solar cell panel shown in FIG. 1.
Figure 5:
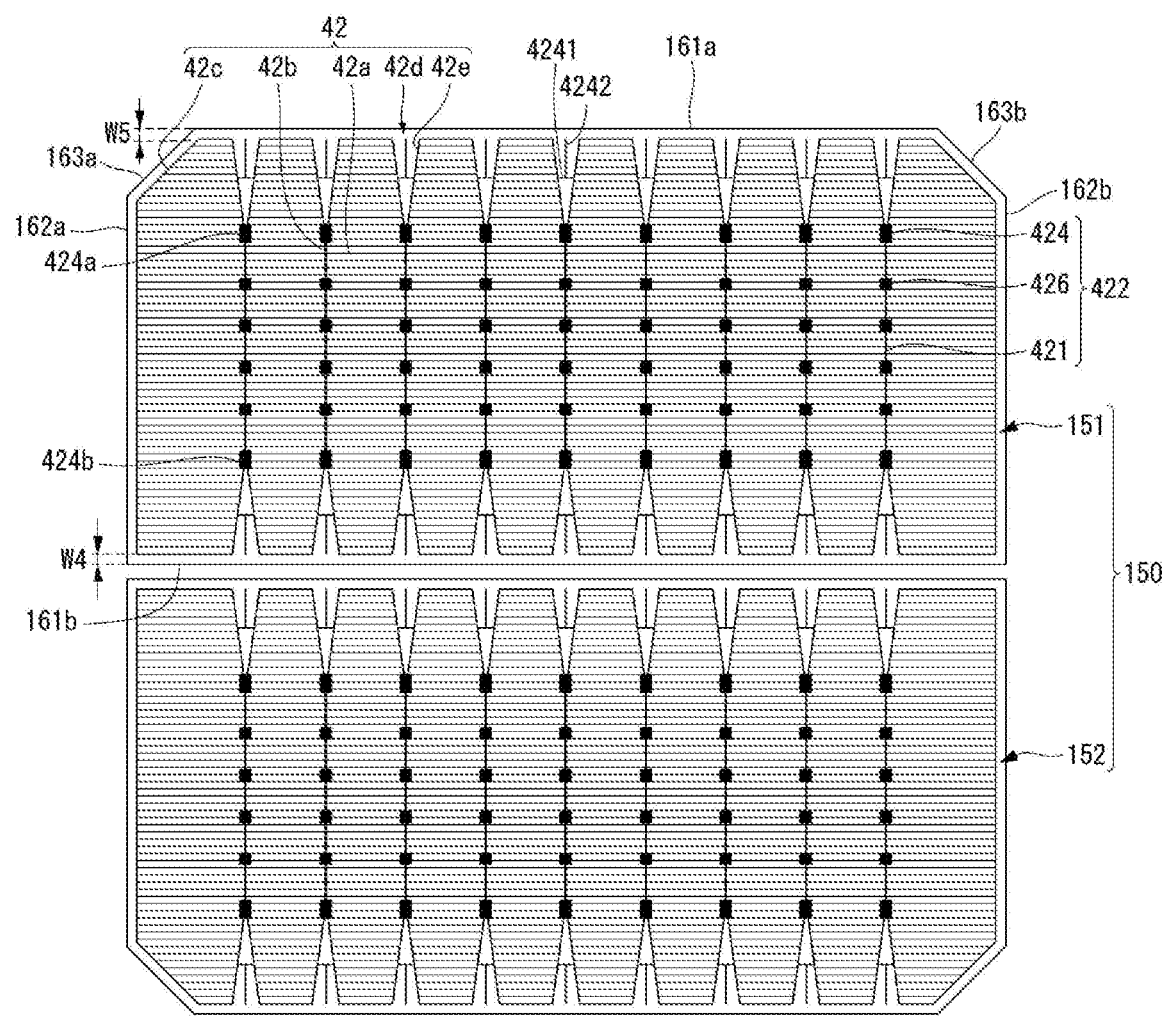
FIG. 5 is a front plan view schematically showing a first solar cell and a second solar cell manufactured by cutting the mother solar cell shown in FIG. 4.

FIG. 4 is a front plan view schematically showing the mother solar cell 150a including the plurality of solar cells 150 applicable to the solar cell panel 100 shown in FIG. 1. FIG. 5 is a front plan view schematically showing the first solar cell 151 and the second solar cell 152 manufactured by cutting the mother solar cell 150a shown in FIG. 4. For simplicity and clarity, the semiconductor substrate 160 and the first electrode 42 are mainly shown in FIGS. 4 and 5.

Referring to FIGS. 4 and 5, in the embodiment, the mother solar cell 150a is cut along a cutting line CL to form the first and second solar cells 151 and 152, which are the plurality of unit solar cells. Each of the first and second solar cells 151 and 152 serving as a unit solar cell functions as one solar cell 150. When the mother solar cell 150a is separated into two solar cells 150, the output loss (that is, cell to module loss (CTM loss)), which may be generated during the plurality of solar cells 150 are connected to form a solar cell panel 100, can be reduced.

To explain this in more detail, the output loss has a value obtained by multiplying the square of the current by the resistance of each solar cell, and the output loss of the solar cell panel including the plurality of solar cells has a value obtained by multiplying the above value, obtained by multiplying the square of the current by the resistance of each solar cell, by the number of solar cells. However, there is also the current generated by the area of the solar cell itself in the current of each solar cell. The corresponding current is increased when the area of the solar cell is increased, while the corresponding current is decreased when the area of the solar cell is decreased.

When the mother solar cell 150a is cut to form the plurality of solar cells 150 and the plurality of solar cells 150 are connected to each other as in the embodiment, the current is reduced in proportion to the area while the number of the solar cells 150 is increased inversely. For example, when there is one cut line CL and two solar cells 150 are manufactured from the one mother solar cell 150a, the current in each solar cell 150 is a half of the current of the mother solar cell 150a and the number of solar cells 150 is twice that of the mother solar cell 150a. As described above, since the current is reflected as square value in the output loss and the number is reflected as it is, when the current is reduced to the half and the number is doubled, the output loss value is reduced to a half. Accordingly, when the plurality of solar cells 150 are manufactured by cutting the mother solar cell 150a and thus the solar cell panel 100 is manufactured using the plurality of solar cells 150 as in the embodiment, the output loss of the solar cell panel 100 can be reduced.

In the embodiment, the mother solar cell 150a is manufactured by a general or conventional manufacturing method and then cut to the plurality of solar cells 150 to reduce the area of the solar cell 150. Accordingly, after the mother solar cell 150a is manufactured by using the existing equipment and the optimized design, the mother solar cell 150a is cut. As a result, the equipment and process cost can be minimized. On the other hand, if the size of the mother solar cell 150a itself is reduced, there is a burden to replace the used equipment or to change the setting of the equipment or the design of the solar cell 150.

Generally, the semiconductor substrate 160 of the mother solar cell 150a is manufactured from an ingot, and thus, has a circular shape, a square shape, or the like where lengths of two sides according to two axes perpendicular to each other (e.g., an axis parallel to a finger line 42a and another axis parallel to a bus bar 42b) are substantially the same as or similar to each other. For example, in the embodiment, the semiconductor substrate 160 of the mother solar cell 150a may have an octagonal shape having inclined sides 163a and 163b at four corner portions in an approximate square shape. With such a shape, the semiconductor substrate 160 having the widest area can be obtained from the same ingot. Accordingly, the mother solar cell 150a has a symmetrical shape, and a maximum horizontal axis and a maximum vertical axis have the same lengths, and a minimum horizontal axis and a minimum vertical axis have the same lengths.

Since the solar cell 150 is formed by cutting the mother solar cell 150a along the cutting line CL in the embodiment, the semiconductor substrate 160 of the solar cell 150 has a shape having a long axis and a short axis. In the embodiment, the cutting line CL extends in a first direction that is a longitudinal direction of the first and second conductivity type regions 32 and 34 and the finger line 42a. The plurality of solar cells 150 extend in the first direction in the mother solar cell 150a.

The solar cell 150 has first and second long sides 161a and 161b parallel to each other and along the long axis (e.g., the first direction) and first and second short sides 162a and 162b parallel to each other and along the short axis (e.g., a second direction crossing to the first direction and parallel to a longitudinal direction of the bus bar 42b). Also, the semiconductor substrate 160 may have a first inclined side 163a and a second inclined side 163b. The first inclined side 163a connects the first long side 161a and the first short side 162a, and the second inclined side 163b connects the first long side 161a and the second short side 162b. The second long side 161b and the first short side 162a may be connected to each other and the second long side 161b and the second short side 162b may be connected to each other. The first long side 161a is shorter than the second long side 161b, the first short side 162a and the second short side 162b may have the same lengths, and the first inclined side 163a and the second inclined side 163b may have the same lengths. However, the embodiments of the invention are not limited thereto, and the solar cell 150 or the semiconductor substrate 160 may have a rectangular shape consisting of the first and second long sides 161a and 161b and the first and second short sides 162a and 162b without the first and second inclined sides 163a and 163b. Various other variations are possible.

Referring to FIGS. 1 to 5, in the embodiment, the first electrodes 42 at a surface of the semiconductor substrate 160 may include the finger lines 42a and the bus bar 42b. The finger lines 42a extend in the first direction (a horizontal direction in the drawing) parallel to the long axis and parallel to each other. The bus bar 42b is electrically connected to the finger lines 42a and extend in the second direction (a vertical direction in the drawing) crossing (e.g., perpendicular to) the finger lines 42a. The lead 142 is connected or attached to the bus bar 42b. In the drawings, the first electrode 42 further includes a peripheral line 42c, an edge electrode portion 42d, and a peripheral portion 42e. The peripheral lines 42c may connect ends of the plurality of finger lines 42a in the vicinity of both sides of the plurality of finger lines 42a as a whole. The peripheral line 42c, the edge electrode portion 42d, and the peripheral portion 42e may have the same or similar width as the finger line 42a and may be made of the same material as the finger line 42a. However, the peripheral line 42c, the edge electrode portion 42d, and the peripheral portion 42e may be not included.

The finger lines 42a may have uniform widths and be spaced apart from each other with a uniform pitch. At this instance, the width of the lead 142 may be smaller than the pitch of the finger lines 42a, and may be larger than the width of the finger line 42a. However, the embodiments of the invention are not limited thereto and various modifications are possible. Here, the finger lines 42a may extend in the first direction parallel to the long axis to be parallel to each other, and may be parallel to main edges of the solar cell 150 (more particularly, the first and second long sides 161a and 161b).

The bus bar 42b may be positioned so as to correspond to a portion where the lead 142 for connection with the neighboring solar cell 150 is located. The bus bars 42b may be provided so as to correspond one-to-one to the leads 142 located on the same surface as the bus bars 142. Accordingly, in the embodiment, a number of the bus bars 42b and a number of the leads 142 are the same on one surface of the solar cell 150.

In the embodiment, the bus bar 42b may include a plurality of pad portions 422 positioned in the second direction to correspond to the respective lead 142. The bus bar 42b may further include a line portion 421 having a width smaller than a width of the pad portion 422 and longitudinally extending in a direction that the lead 142 is connected between the pad portions 422.

The pad portion 422 is a region having a relatively large width, and thus, the lead 142 is substantially attached and fixed to the pad portion 422. A width of the pad portion 422 measured in the first direction is larger than each of a width of the line portion 421, a width of the finger line 42a, a width of the peripheral line 42c, a width of the edge electrode portion 42d, and/or a width of the peripheral portion 42e. Also, the width of the pad portion 422 measured in the first direction may be the same as or greater than a width of the lead 142. A length of the pad portion 422 measured in the second direction may be also greater than each of the width of the line portion 421, the width of the finger line 42a, the width of the peripheral line 42c, the width of the edge electrode portion 42*d*, and/or the width of the peripheral portion 42*e*. By the pad portion 422, the adhesion force between the lead 142 and the bus bar 42*b* can be improved and the contact resistance between the lead 142 and the bus bar 42*b* can be reduced.

In this instance, the plurality of pad portions 422 include outer pads 424 located on both sides (or opposite sides or opposite ends) of the bus bar 42*b* in the second direction. Here, the outer pads 424 may include a first outer pad 424*a* and a second outer pad 424*b*, which are the closest pad portions 422 to the first or second long sides 161*a* or 161*b* of the solar cell 150 (or the semiconductor substrate 160) in the second direction among the plurality of pad portions 422. Accordingly, the finger lines 42*a* extend in the first direction parallel to the long axis, and thus, the finger lines 42*a* can be densely and uniformly arranged in the solar cell 150. Also, the outer pads 424*a* are positioned on both sides in the second direction parallel to the short axis, and thus, the attachment characteristics of the lead 142 attached to the outer pads 424*a* can be improved.

The outer pads 424 may be inwardly positioned than the outermost finger lines 42*a* adjacent to the long sides 161*a* and 161*b* when viewed in the second direction. Thus, the distance between the first and second outer pads 424*a* and 424*b* in the second direction is smaller than the distance between the outermost finger lines 42*a* located on both sides in the second direction (i.e., the uppermost and lowermost finger lines 42*a* in the drawings.

The lead 142 is connected from the front surface of the solar cell 150 to the back surface of the solar cell 150 in the vicinity of the long sides 161*a* and 161*b* of the solar cell 150. Accordingly, in the vicinity of the long sides 161*a* and 161*b* of the solar cell 150, a force applied to the lead 142 toward an outside of the solar cell is large and thus the adhesion between the lead 142 and the electrodes 42 and 44 may be reduced. Such a problem may be largely generated in the instance of the lead 142 with a wire shape having a narrow width and a contacted surface with a small area as in the embodiment. In consideration of this, in the embodiment, the outer pads 424 having a large area are formed adjacent to the long sides 161*a* and 161*b*. In addition, the outer pads 424 and the long sides 161*a* and 161*b* of the solar cell 150 are separated from each other by a predetermined distance to minimize the force applied to the lead 142.

For example, the first outer pad 424*a* and the second outer pad 424*b* may be symmetrical to each other in the second direction with respect to an imaginary line (e.g., an imaginary line passing through a center between outer edges of the first and second outer pads 424*a* and 424*b*) extending along the first direction of the solar cell 150. Thus, the current flow can be stable, and an apparatus used for a general or conventional symmetrical structure can be used as is.

The plurality of pad portions 422 include inner pads 426 other than the outer pads 424. The inner pad 426 may be a pad located between the two outer pads 424. In the embodiment, a plurality of inner pads 426 are provided at predetermined intervals in each of the bus bars 42*b* so that the attachment characteristics with the lead 142 can be improved.

The line portion 421 connects the plurality of finger lines 42*a* and the pad portions 422 to provide a path through which the carrier can bypass when some finger lines 42*a* are disconnected. A width of the line portion 421 measured in the first direction may be smaller than widths of the pad portion 422 and the lead 142 and may be smaller than, the same as, or greater than the width of the finger line 42*a* measured in the second direction. When the line portion 421 has a relatively narrow width, the area of the first electrode 42 can be minimized and thus the shading loss and material cost can be reduced. The lead 142 may be attached to the line portion 421 or the lead 142 may be placed on the line portion 421 in the state that the lead 142 is not attached to the line portion 421.

In the embodiment, six or more bus bars 42*b* (or six or more leads 142 corresponding to the bus bars 424 one-to-one) may be provided on one side of the semiconductor substrate 160 in the first direction. Thus, by reducing the pitch of the bus bar 42*b*, the movement path of the current flowing along the finger line 42*a* arranged along the long axis can be minimized. For example, six to thirty-three bus bars 42*b* (or six to thirty-three leads 142 corresponding to the bus bars 424 one-to-one) may be provided in the first direction on one surface of the semiconductor substrate 160. If the number of the bus bars 42*b* or the leads 142 exceeds thirty-three, the material cost and optical loss may increase. Considering that the solar cell 150 has the short axis and the long axis and thus has a relatively small area, along with the material cost and optical loss, the number of the bus bars 42*b* or the leads 142 may be six to fourteen (e.g., six to twelve). However, the embodiments of the invention are not limited thereto, and the number of the leads 142 and thus the number of the bus bars 42*b* may have any of different values.

In the embodiment, the solar cell 150 (or the semiconductor substrate 160) may include an electrode area EA and an edge area PA.

In the embodiment, the electrode area EA is a region in which the finger lines 42*a* parallel to each other are arranged at a uniform pitch, and the electrode area EA may include a plurality of electrode areas EA defined by the bus bars 42*b*. The edge area PA may be a region located adjacent to the edge of the semiconductor substrate 160 or the solar cell 150 and may include a region between the adjacent two electrode areas EA. The edge area PA may be a region where the first electrode 42 is located at a density lower than that of the finger line 42*a* of the electrode area EA or a region where the first electrode 42 is not located.

The electrode area EA may include a first electrode area EA1 located between two neighboring bus bars 42*b* and two second electrode areas EA2 located between the bus bar 42*b* and the short sides 162*a* and 162*b* of the solar cell 150, respectively. In this instance, a width W1 of the first electrode area EA1 may be smaller than a width W2 of the second electrode area EA2. In the embodiment, a large number of bus bars 42*b* are provided. Therefore, when the width W2 of the second electrode area EA2 is relatively large, the inclined sides 163*a* and 163*b* may be positioned in the second electrode area EA2. Since the bus bar 42*b* and the lead 142 are not located on the inclined sides 163*a* and 163*b*, a problem of interference or a problem that the current flow is not smooth, which may occur when they are located on the inclined sides 163*a* and 163*b* or current, can be prevented or reduce. However, the embodiments of the invention are not limited thereto, and the width W1 of the first electrode area EA1 and the width W2 of the second electrode area EA may have any of various values.

The edge area PA may include a first edge area PA1 and a second edge area PA2. The first edge area PA1 corresponds to a portion where the lead 142 is located between the finger lines 42*a*. The second edge area PA2 is a portion other than the first end portion PA1 has a predetermined width between the outermost finger lines 42*a* and the edge of the semiconductor substrate 160. The first edge area PA1 may be located at a portion adjacent to the edge of the solar cell 150 where the lead 142 is located. The first edge area PA1 is an area for separating the outer pad 424 from the edge of the solar cell 150 so that the lead 142 can be attached to the first electrode 42 with sufficient bonding force.

The first electrode 42 may further include the edge electrode portion 42*d* which overlaps the lead 142 in the first edge area PA1 and the peripheral portion 42*e* for partitioning the electrode area EA and the first edge area PA1.

The peripheral portion 42*e* extends from an end (or the outer pad 424) of the bus bar 42*b*, extends via ends of the plurality of finger lines 42*a* adjacent to the edge area PA1, and reaches ends of the outermost finger lines 42*a*. The peripheral portion 42*e* serves to provide a path through which the carrier flows when the finger line 42*a* adjacent to the edge area PA1 is disconnected or the like. The edge electrode portion 42*d* located in the edge area PA1 may be connected to the finger line 42*a* via the peripheral portion 42*e*. The current collected by the finger line 42*a* located in the electrode area EA adjacent to the edge area PA1 may pass the peripheral portion 42*e* and the edge electrode portion 42*d*, and reach the lead 142. However, the embodiments of the invention are not limited thereto, and the edge electrode portion 42*d* in the first edge area PA1 may be directly connected to the finger line 42*a* without passing through the peripheral portion 42*e*. Various other variations are possible.

The peripheral portion 42*e* may be inclined to the finger lines 42*a* and the bus bars 42*b* so that a width of the first edge area PA1 gradually increases as it goes toward the edge of the solar cell 150 (i.e., the long side 161*a*, 161*b*). In one example, the first edge area PA1 may have a rough or general triangular shape, and the two peripheral portions 42*e* that define the first edge area PA1 may have a rough or general "V shape". Thereby, an interval between both ends of the finger lines 42*a* in the two electrode areas EA adjacent to the first edge area PA1 may gradually increase.

Thus, the lead 142 may be stably positioned in the first edge area PA1 so that the lead 142 is not attached to the peripheral portion 42*e*. In the embodiment, an end of the lead 142 that is not connected to the other solar cell 150 passes the end of the outer pad 424 and extends to the inside of the first edge area PA1. Thus, the end of the lead 142 can be stably fixed and the lead 142 can be attached with the sufficient adhesive force by the pad portions 422. Also, a problem, such as short-circuit, that may generated when the lead 142 extends to the second edge area PA2 can be prevented.

The lead 142 overlaps or is in contact with the edge electrode portion 42*d* and thus is electrically connected to the edge electrode portion 42*d*. As a result, the edge electrode portion 42*d* is a path through which the current can flow to the lead 142, and the current generated in the portion of the electrode area EA adjacent to the first edge area PA1 can be transferred to the lead 142. Thus, even when the first edge area PA1 is provided to improve the adhesive force or the bonding force of the lead 142, it is possible to prevent or reduce the efficiency from being lowered. Thus, the efficiency of the solar cell 150 can be improved and the output of the solar cell panel 100 can be improved.

In this instance, the edge electrode portion 42*d* may have a shape that can be connected to the finger line 42*a*, the bus bar 42*b*, or the lead 142 in the embodiment. The edge electrode portion 42*d* is positioned in the first edge area PA1 so as to have a density less than that of the finger line 42*a* in the electrode area EA.

In one example, the first edge areas PA1 and the edge electrode portions 42*d* located therein may be symmetrical with respect to an imaginary line (e.g., an imaginary line passing through a center between the outer edges of the first and second outer pads 424*a* and 424*b*) along the first direction of the solar cell 150. As a result, the current can be effectively collected at both edge portions of the semiconductor substrate 160 and the attachment characteristics of the lead 142 can be improved.

In the embodiment, the edge electrode portion 42*d* has an opening in an interior thereof and the end of the edge electrode portion 42*d* is located in the same line as the outermost finger line 42*a* or outwardly protrudes than the outermost finger line 42*a* (i.e., is closer the edge of the semiconductor substrate 160 (that is, the long sides 161*a*, 161*b*) than the outermost finger line 42*d*. The edge electrode portion 42*d* can have the low density while the edge electrode portion 42*d* and the finger line 42*a* can be smoothly connected. Thus, the collected current can be effectively transmitted to the lead 142 without being remained.

More particularly, the edge electrode portion 42*d* includes a first electrode portion 4241 inwardly located than the outermost finger line 42*a* and a second electrode portion 4242 extending in a direction crossing the first electrode portion 4241 from the first electrode portion 4241 to the same line of the outer finger line 42*a* or the outside of the outermost finger line 42*a*.

In this instance, the first electrode portion 4241 may be parallel to the finger line 42*a* or cross (e.g., is perpendicular to) the line portion 421 and may be connected to the finger lines 42*a* (directly connected to the finger lines 42*a* or connected to the finger lines 42*a* via the peripheral portion 42*e*) in the electrode areas EA at both sides of the first edge area PA1. The second electrode portion 4242 may cross (e.g., be perpendicular to) the finger line 42*a* or may be parallel to the line portion 421.

In the embodiment, for example, the width of the line portion 421, the finger line 42*a*, the peripheral line 42*c*, the edge electrode portion 42*d*, or the peripheral portion 42*e* (in a direction crossing (e.g., perpendicular to) its longitudinal direction) may be in the range of about 35 μm to 350 μm. In the range of the width, it is possible to prevent or limit an increase in optical loss, material cost, and the like, while improving contact characteristics. For example, the width of the line portion 421, the finger line 42*a*, the peripheral line 42*c*, the edge electrode portion 42*d*, or the peripheral portion 42*e* may be about 35 μm to 200 μm (more specifically, about 35 μm to 120 μm). The width of the pad portion 422 in the first direction may be about 0.25 mm to 2.5 mm. The width of the pad portion 422 is determined so as to reduce the shading loss due to optical loss while ensuring a sufficient contact area with the lead 142. For example, the width of the pad portion 422 may be about 0.8 mm to 1.5 mm.

Additionally, a length of the outer pad 424 in the second direction may be greater than a length of the inner pad 426. For example, the length of the outer pad 424 may be about 0.4 mm to 30 mm, and the length of the outer pad 424 may be about 0.4 mm to 3.2 mm considering the light loss more. The length of the inner pad 426 may be about 0.035 mm to 1 mm, more particularly, about 0.4 mm to 1 mm. As a result, the adhesion force by the outer pad 424 to which a large force is applied can be further improved, and the optical loss, the material cost, and the like can be reduced because the area of the inner pad 426 is reduced.

In the embodiment, the first electrode 42, the lead 142, the electrode area EA, the edge area PA, and the like are symmetrical with respect to each other in the first direction and with respect to an imaginary line (e.g., an imaginary line passing through a center between the outer edges of the first and second outer pads 424*a* and 424*b*). Thus, current flow can be stably realized. However, the embodiments of the invention are not limited thereto.

The solar cell 150 according to the embodiment may include an alignment mark 420. When the solar cell panel 100 is manufactured, the solar cell 150 can be aligned and positioned at a desired position by using the alignment marks 420. The alignment mark 420 may be formed by any of various methods using any of various materials. For example, the alignment mark 420 may be formed using a material the same as the first electrode 42 in the process of forming the first electrode 42. However, the embodiments of the invention are not limited thereto.

Similarly, in the embodiment, the second electrode 44 located on the other side of the semiconductor substrate 160 includes a bus bar at a position corresponding to the bus bar 42b in the second direction, and may include a finger line, a peripheral line, an edge electrode portion, a peripheral portion, and the like. It is sufficient that the second electrode 44 has the bus bar, and thus, the second electrode 44 may not include the finger line, the peripheral line, the edge electrode portion, the peripheral portion, and the like. The descriptions of the finger line 42a, the bus bar 42b, the peripheral line 42c, the edge electrode portion 42d, and the peripheral portion 42e of the first electrode 42 may be applied to the finger line, the bus bar, the peripheral line, the edge electrode portion, and the peripheral portion of the second electrode 44 as they are. Also, the second electrode 44 may have an alignment mark.

The first and second electrodes 42 and 44 may include the same number of bus bars 42b, and the bus bar 42b of the first and second electrodes 42 and 44 may be positioned at the same positions at the opposite surfaces of the semiconductor substrate 160. The width, pitch, and number of the finger lines 42a of the first electrode 42 may be the same as those of the finger lines of the second electrode 44, or at least one of the width, pitch, and number of the finger lines 42a of the first electrode 42 may be different from that of the finger lines of the second electrode 44. The width, length, pitch, and number of the pad portions 422 of the first electrodes 42 may be the same as those of the pad portions of the second electrodes 44. At least one of the width, length, pitch, and number of the pad portions 422 of the first electrodes 42 may be different from that of the pad portions of the second electrodes 44. In addition, the first electrode 42 and the second electrode 44 may have different planar shapes. Also, various other modifications are possible.

In the solar cell 150 having the long axis and the short axis, a ratio (W1/W3) of the pitch of the bus bar 42b (i.e., the width W1 of the first electrode area EA1) with respect to the width W3 of the semiconductor substrate 160 (or the solar cell 150) in the second direction may be 0.35 or less. By limiting the ratio (W1/W3) of the pitch of the bus bar 42b to the width W3 of the semiconductor substrate 160 below a certain value, the current flowing path can be minimized and thus the efficiency of solar cell 1500 can be further improved.

Conventionally, the ratio (W1/W3) of the pitch of the bus bar 42b to the width W3 of the semiconductor substrate 160 exceeds 0.35 even though the long axis and the short axis are provided, and the path through which the current flows cannot be optimized. Accordingly, it has been difficult to sufficiently realize the effect of the solar cell 150 having the short axis and the long axis in order to reduce the current. On the other hand, in the embodiment, the efficiency of the solar cell 150 having the short axis and the long axis can be effectively improved by limiting the ratio (W1/W3) of the pitch of the bus bar 42b to the width W3 of the semiconductor substrate 160 below the certain value.

For example, the ratio (W1/W3) of the pitch of the bus bar 42b to the width W3 of the semiconductor substrate 160 may be about 0.1 to 0.35. A reduction of the pitch of the bus bar 42b may reduce the current flow path, but the number of the bus bars 42b and the number of the leads 142 may be excessively increased, which may increase cost and process time. Accordingly, the ratio (W1/W3) of the pitch of the bus bars 42b to the width W3 of the semiconductor substrate 160 may be 0.1 or more. However, the embodiments of the invention are not limited thereto.

In the embodiment, the cutting line CL may be arranged in the first direction parallel to the longitudinal direction of the finger line 42a or the long axis. The electrodes 42 and 44 may be symmetrical with respect to the imaginary line parallel to the first direction. Therefore, even after cutting the solar cell 150, there is no large difference between the two sides when viewed in the second direction, and therefore the solar cell 150 can be freely arranged in the solar cell panel 100 without the distinction of the both sides.

In this instance, the second long sides 161b of the first or second solar cells 151 and 152 corresponds to a cut surface formed by cutting along the cutting line CL, while the first long side 161a, the first and second short sides 162c and 162b, and the first and second inclined sides 163a and 163b are non-cut surfaces. Whether it is the cut surface or the non-cut surface may be seen from the presence or the absence of the first and second inclined sides 163a and 163b or the difference in surface roughness on the microscope, the difference in surface morphology, and the like.

In this instance, a first gap (or a first interval) W4 between the cut surface and the conductivity type regions 20 and 30 and/or ends of the electrodes 42 and 44 adjacent to the cut surface may be smaller than a second gap (or a second interval) W5 between the non-cut surface and the conductivity type regions 20 and 30 and/or the ends of the electrodes 42 and 44 adjacent to the non-cut surface. A portion including the cut line CL is a non-active region in which the conductivity type regions 20 and 30 and/or the electrodes 42 and 44 are not formed to prevent shunts and the like. This is for maximizing an area contributing to a photoelectric conversion by minimizing a width of the non-active region. As described above, the conductivity type regions 20 and 30 and the electrodes 42 and 44 are not symmetrical with respect to the first long side 161a which is the non-cut face and the second long side 161b which is the cut surface, while the conductivity type regions 20 and 30 and the electrodes 42 and 44 are symmetrical with respect to the first and second short sides 161a and 162b which is the non-cut surface. However, the embodiments of the invention are not limited thereto, and the first gap W4 may be equal to or larger than the second gap W5.

For simple descriptions and illustrations, it is exemplified that two solar cells 150 are manufactured in one mother solar cell 150a. In this instance, the cutting line CL may pass a center of the mother solar cell 150a. Then, each solar cell 150 has substantially the same area and can have similar electrical characteristics. Particularly, when the mother solar cell 150a having an approximate octagonal shape is cut to manufacture two solar cells 150, each solar cell 150 is divided to include first and second long sides 161a and 161b, the first and second short sides 162a and 162b, and the first and second included sides 163a and 163b.

Figure 6:
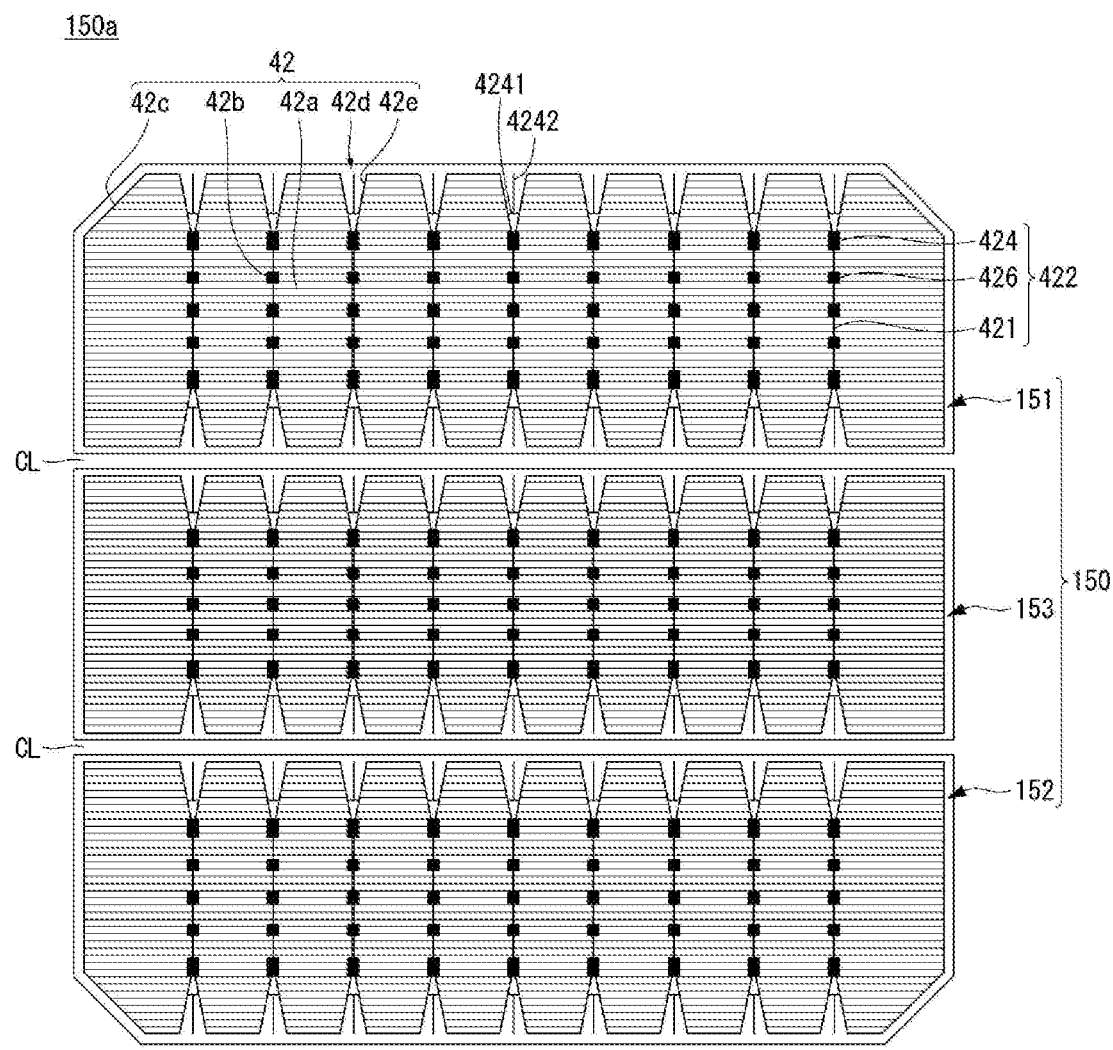
FIG. 6 is a front plan view schematically showing a mother solar cell including a plurality of solar cells applicable to a solar cell panel according to a modified embodiment of the invention.

However, the embodiments of the invention are not limited thereto. Therefore, as shown in FIG. 6, there may be two or more cutting lines CL parallel to each other. According to this, the number of solar cells 150 manufactured from one mother solar cell 150a may be one more than the number of the cutting lines CL. The areas where the conductivity type regions 20 and 30 and the electrodes 42 and 44 are formed may be formed with substantially the same width and may be spaced apart by a uniform distance when the number of the cutting lines CL is two or more.

However, in the embodiment, since the outer pads 424 located inwardly than the outermost finger lines 42a in the second direction parallel to the short axis are located on both sides, if the cutting lines CL are too many, it is difficult to arrange them smoothly. In consideration of this, the number of the cutting line CL may be three or less and the number of the solar cells 150 manufactured from one mother solar cell 150a may be four or less. Accordingly, for example, a ratio (W3/L) of the width W3 (see FIG. 4) of the semiconductor substrate 160 in the second direction to the length L (see FIG. 4) of the semiconductor substrate 160 in the first direction may be about 0.2 to 0.5. Even though the ratio (W3/L) is 0.25 when four solar cells 150 are manufactured from one mother solar cell 150a the portion including the cut line CL, the ratio (W3/L) is limited to 0.2 or more in the embodiment in consideration of the process error, design freedom, and the like.

As shown in FIG. 6, when mother solar cell 150a having the approximate octagonal shape is cut along two or more cut surfaces, the upper and lower solar cells 150 in the drawing are the first and second solar cells 151 and 152, respectively, having the first and second long sides 161a and 161b (see FIG. 5), the first and second short sides 162a and 162b (see FIG. 5), and the first and second inclined sides 163a and 163b (see FIG. 5). At this instance, the second long side 161b is the cut surface cut by the cutting line CL and the remaining edges are the non-cut surfaces. The descriptions of FIGS. 4 and 5 may be applied to the first and second solar cells 151 and 152 as they are.

The solar cell 150 positioned in a center portion is a third solar cell 153 having the first and second long sides 161a and 161b and the first and second short sides 162a and 162b without the first and second inclined sides 163a and 163b. In the third solar cell 153, the first and second long sides 161a and 161b are cut surfaces cut by the cutting line CL and the first and second short sides 162a and 162b are non-cut surfaces. Accordingly, the third solar cell 153 may have a rectangular shape different from the first and second solar cells 151 and 152. In this instance, since the first and second long sides 161a and 161b are both formed by the cut surfaces, the conductivity type regions 20 and 30 and/or the electrodes 42 and 44 are symmetrical in the second direction.

The solar cell 150 described above is electrically connected to the neighboring solar cell 150 by the leads 142 positioned on (e.g., in contact with) the first electrode 42 or the second electrode 44. This will be described in more detail with reference to FIG. 7 together with FIGS. 1 to 5.

Figure 7:
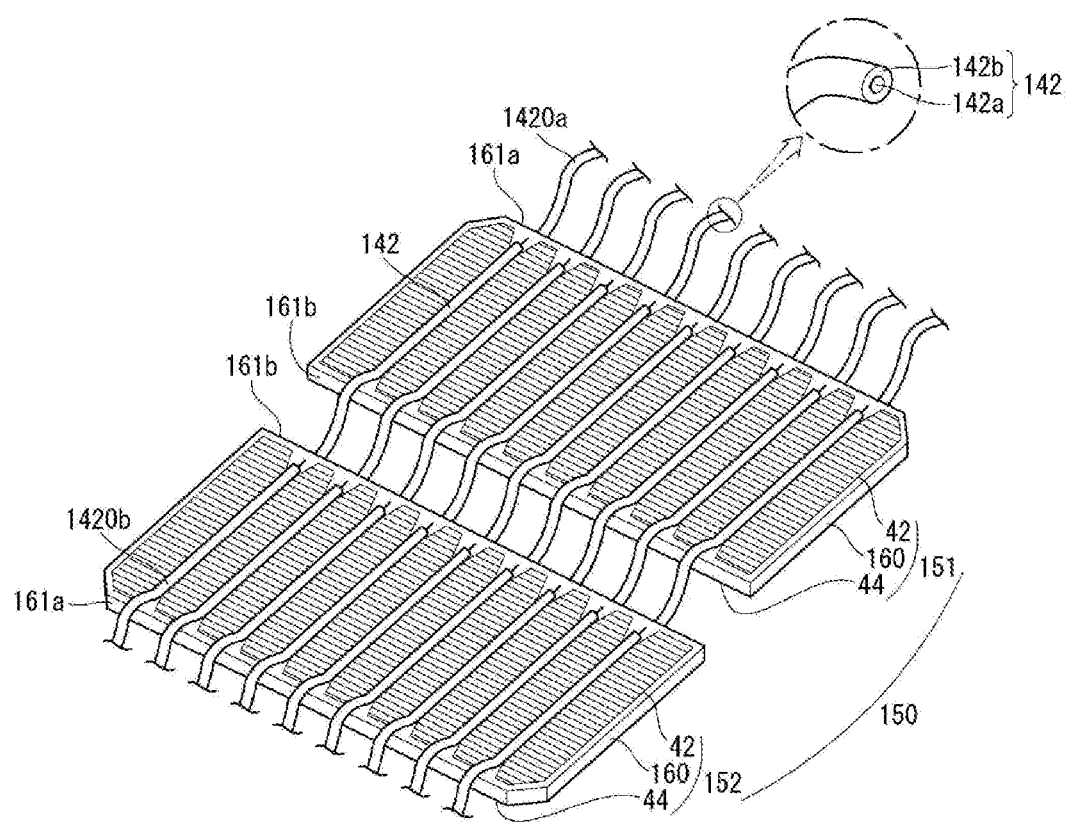
FIG. 7 is a perspective view schematically showing the first solar cell and the second solar cell connected by the leads, which are included in the solar cell panel shown in FIG. 1.

FIG. 7 is a perspective view schematically showing the first solar cell 151 and the second solar cell 152 connected by the leads 142, which are included in the solar cell panel 100 shown in FIG. 1. Here, the first and second solar cells 151 and 152 are unit solar cells manufactured by cutting the mother solar cell 150a and have the long and short axes. The first and second solar cells 151 and 152 are schematically shown only based on the semiconductor substrate 160 and the electrodes 42 and 44 in FIG. 7 for simplicity and clarity.

As shown in FIG. 7, two solar cells 150 (e.g., the first solar cell 151 and the second solar cell 152) adjacent to each other among the plurality of solar cells 150 are connected by the lead 142. In this instance, the lead 142 electrically connects the first electrode 42 on the front surface of the first solar cell 151 and the second electrode 44 on the back side of the second solar cell 152 positioned on one side (the left and lower side) of the first solar cell 151. Another lead 1420a electrically connects the second electrode 44 on the back surface of the first solar cell 151 and the first electrode 42 on the front side of another solar cell, which will be positioned on the other side (the right and upper side) of the first solar cell 151. Still another lead 1420b electrically connects the first electrode 42 on the front surface of the second solar cell 152 and the second electrode 44 on the back side of still another second solar cell, which will be positioned on one side (the left and lower side) of the second solar cell 152. Accordingly, the plurality of solar cells 150 can be connected to each other by the leads 142, 1420a, and 1420b. Hereinafter, the descriptions of the lead 142 can be applied to the leads 142, 1420a, and 1420b that connect the two adjacent solar cells 150 to each other.

In this embodiment, each lead 142 may include a first section connected to the first electrode 42 of the first solar cell 151 (in more detail, the bus bar 42b of the first electrode 42) at the front surface of the first solar cell 151 while extending from the first long side 161a of the first solar cell 151 toward the second long side 161b of the first solar cell 151 opposite the first long side 161a, a second section connected to the second electrode 44 of the second solar cell 152 (in more detail, the bus bar of the second electrode 44) at the back surface of the second solar cell 152 while extending from the second long side 161b of the second solar cell 152 toward the first long side 161a of the second solar cell 152 opposite the second long side 161b of the second solar cell 152, and a third section extending from the front surface of the first solar cell 151 to the back surface of the second solar cell 152, to connect the first section and second section. Accordingly, the lead 142 may be arranged to extend across the first solar cell 151 along a portion of the first solar cell 151 while extending across the second solar cell 152 along a portion of the second solar cell 152. Since the lead 142 is formed only in regions corresponding to portions of the first and second solar cells 151 and 152 (e.g., the bus bar 42b) while having the smaller width than the first and second solar cells 151 and 152, the lead 142 may effectively connect the first and second solar cells 151 and 152 in spite of the small area thereof.

For example, the lead 142 may be arranged at the corresponding first and second electrodes 42 and 44 of the first and second solar cells 151 and 152, to extend lengthily along the bus bar 42b of the first and second electrodes 42 and 44 while contacting the bus bar 42b. Accordingly, the lead 142 continuously contacts the first and second electrodes 42 and 44 and, as such, electrical connection characteristics may be enhanced. In the embodiment, the lead 142 may extend in the second direction parallel to the short axis. However, the embodiments of the invention are not limited thereto.

With reference to one surface of each solar cell 150, the plurality of leads 142 are provided and, as such, electrical connection characteristics of the solar cell 150 to another, neighboring solar cell 150 may be enhanced. In particular, in the embodiment, each lead 142 is constituted by a wire having a smaller width than a ribbon having a relatively great width (e.g., 1 to 2 mm), which has been used in conventional instances. To this end, a number of leads 142 (e.g., two to five) greater than a number of ribbons as described above is used with reference to one surface of each solar cell 150.

In one example, each lead 142 includes a core layer 142a, and a solder layer 142b coated on an outer surface of the core layer 142a with a small thickness. The solder layer 142b may include a solder material for soldering the lead 142 and the electrodes 42 and 44. For example, the core layer 142a may include a material exhibiting excellent electrical conductivity (e.g., a metal, in more detail, Ni, Cu, Ag, or Al) as a major material thereof (e.g., a material having a content of 50 wt % or more, in more detail, a material having a content of 90 wt % or more). The solder layer 142b may include a material such as Pb, Sn, SnIn, SnBi, SnPb, SnPbAg, SnCuAg or SnCu as a major material thereof. Of course, the invention is not limited to the above-described materials and, the core layer 142a and the solder layer 142b may include any of various materials.

When the wire, which has a smaller width than the existing ribbon, is used as the lead 142, material costs may be greatly reduced. Since the lead 142 has a smaller width than the ribbon, it may be possible to use a sufficient number of leads 142 and, as such, the movement distance of carriers can be minimized. Accordingly, the output power of the solar cell panel 100 can be enhanced.

Also, the wire constituting the lead 142 in accordance with the embodiment may have a rounded portion. That is, the wire constituting the lead 142 may have a circular or oval cross-section, a curved cross-section, or a rounded cross-section, to induce reflection or diffuse reflection. Accordingly, light reflected from a rounded surface of the wire constituting the lead 142 may be reflected or totally reflected upon the front substrate 110 or back substrate 120 disposed at the front surface or back surface of the solar cell 150 and, as such, may be again incident upon the solar cell 150. Thus, the output power of the solar cell panel 100 can be effectively enhanced. Of course, embodiments of the invention are not limited thereto, and the wire constituting the lead 142 may have a quadrangular shape or a polygonal shape. The wire may also have any of various other shapes.

In this embodiment, the lead 142 may have a width (or a diameter) less than 1 mm (i.e. 250 to 500 μm). For reference, in the embodiment, a thickness of the solder layer 142b is very small and is varied depending on a position of the lead 142, and thus, the width of the lead 142 may be a width of the core layer 142a. On the other hand, the width of the lead 142 may be a width of a portion of the lead 142 on the line portion 421 (see FIG. 5) measured in a position passing though a center of the lead 142. By the lead 142, which has the wire shape while having the width, the current generated in the solar cell 150 can be effectively transferred to an outer circuit (e.g., a bus ribbon or a bypass diode of a junction box) or to another solar cell 150. In this embodiment, the lead 142 may be fixed to the electrodes 42 and 44 of the solar cell 150 in the state that each lead 142 is independently disposed on and fixed to the electrodes 42 and 44, and thus, leads 142 are not inserted into a separate layer, film, or the like to be fixed to electrode 42 and 44. If the width of the lead 142 is less than 250 μm, the strength of the lead 142 may be insufficient, and the lead 142 may exhibit inferior electrical connection characteristics and low attachment force because the connection area between the lead 142 and the electrodes 42 and 44 is too small. On the other hand, if the width W1 of the lead 142 is greater than 1 mm (e.g., 500 um), the material costs of the lead 142 increase, and the lead 142 may obstruct incidence of light upon the front surface of the solar cell 150, and thus, shading loss may increase. In addition, force applied to the lead 142 in a direction away from the electrodes 42 and 44 may increase and, as such, attachment force between the lead 142 and the electrodes 42 and 44 may be reduced. In severe instances, cracks or the like may be generated at the electrodes 42 and 44 or the semiconductor substrate 160. For example, the width W1 of the lead 142 may be 350 to 450 um (in particular, 350 to 400 um). In this range, output power of the solar cell panel 100 can be enhanced while the attachment force to the electrodes 42 and 44 can be increased.

In this instance, the solder layer 142b of each lead 142 is positioned separately from the other lead 142 or the other solder layer 142b. Here, the lead 142 has a cross-section of a circular shape before the attachment, while a shape of the lead 142 on the pad portion 422 is deformed when or after the lead 142 is bonded to (e.g., is in contact with) the electrodes 42 and 44 by using the solder layer 142b. That is, in the tabbing process, each of the solder layers 142b flow down to the first or second electrodes 42 and 44 (more specifically, the pad portion 422). Accordingly, as shown in FIG. 3, the width of the solder layer 142b may gradually increase toward the pad portion 422 at a portion adjacent to the pad portion 422. As an example, the portion of the solder layer 142b adjacent to the pad portion 422 may have a width equal to or greater than the diameter or the width of the core layer 142a. More particularly, an upper portion of the solder layer 142b on the core layer 142a has a shape protruding toward an outside of the solar cell 150 according to the shape of the core layer 142a, while the portion of the solder layer 142b adjacent to the pad portion 422 or a lower portion of the solder layer 142b includes a portion having a concave shape with respect to the outside of the solar cell 150. As a result, an inflection point where a curvature changes is located on the side of the solder layer 142b. It can be seen from the shape of the solder layer 142b that the leads 142 are individually attached and fixed by the solder layer 142b without being inserted or covered in a separate layer, film, or the like. The solar cell 150 and the lead 142 can be connected by a simple structure and a simple process through fixing the lead 142 by the solder layer 142b without using the separate layer or a film. In particular, the lead 142 having the narrow width and the rounded shape as in the embodiment can be attached without using the separate layer, film (e.g., a conductive adhesive film including a resin and a conductive material). Accordingly, the process cost and time of the process for attaching the lead 142 can be minimized.

On the other hand, even after the tabbing process, the portion of the lead 142 positioned between the two solar cells 150 has a shape the same as or similar to a shape before the tabbing process (e.g., a cross-section shape of the circular shape).

For example, in the embodiment, the second long side 161b (see FIG. 5) of the first solar cell 151 and the second long side 161b of the second solar cell 152 having the same lengths may face each other. Also, the first long side 161a (see FIG. 5) of the first solar cell 151 and the first long side 161a of another solar cell, which is adjacent to the first solar cell 151 and is opposite to the second solar cell 152, may face each other. Also, the first long side 161a of the second solar cell 152 and the first long side 161a of yet another solar cell, which is adjacent to the second solar cell 152, may face each other. Accordingly, the first long sides 161a, the second long sides 161b, or the inclined sides 163a and 163b (see FIG. 5) having the same length are arranged so as to face each other to improve appearance and a structural stability.

This is because the cutting line CL is parallel to the finger line 42a, and thus, the bus bar 42b is symmetrical with respect to the imaginary line along the first direction. According to this, the first and second solar cells 151 and 152 manufactured from the mother solar cell 150a can be electrically connected as they are without rotating, thereby reducing the processing time and cost required for the rotation. However, the embodiments of the invention are not limited thereto, and the first long side 161a and the second long side 161b of the adjacent solar cells 150 may be arranged to face each other.

According to the solar cell 150 and the solar cell panel 100 including the same, stated in the above, light loss can be minimized by using the bus bar 42b having the small width and/or the lead 142 having the wire shape, and a movement path of the carrier can be reduced by increasing the number of bus bars 42b and/or the leads 142. Thus, efficiency of the solar cell 150 and an output of the solar cell panel 100 can be improved. Further, the light loss can be minimized due to diffused reflection or the like by using the lead 142 having the wire shape, and the movement path of the carrier can be reduced by reducing the pitch of the leads 142. Thus, the efficiency of the solar cell 150 and the output of the solar cell panel 100 can be improved.

Particularly, the efficiency of the solar cell 150 and the output of the solar cell panel 100 can be maximized by applying the lead 142 to the solar cell 150 having the long axis and the short axis. In this instance, the lead 142 may be arranged in the direction parallel to the short axis and the outer pads 424 may be positioned at both sides in the direction parallel to the short axis. Then, the movement path through the lead 142 can be minimized and the attachment property of the lead 142 can be enhanced.

Hereinafter, a solar cell panel according to other embodiments of the invention will be described in detail. Detailed descriptions will be omitted for the same or extremely similar parts as those described above, and only different parts will be described in detail. It is also within the scope of the invention to combine the above-described embodiments or variations thereof with the following embodiments or modifications thereof.

Figure 8:
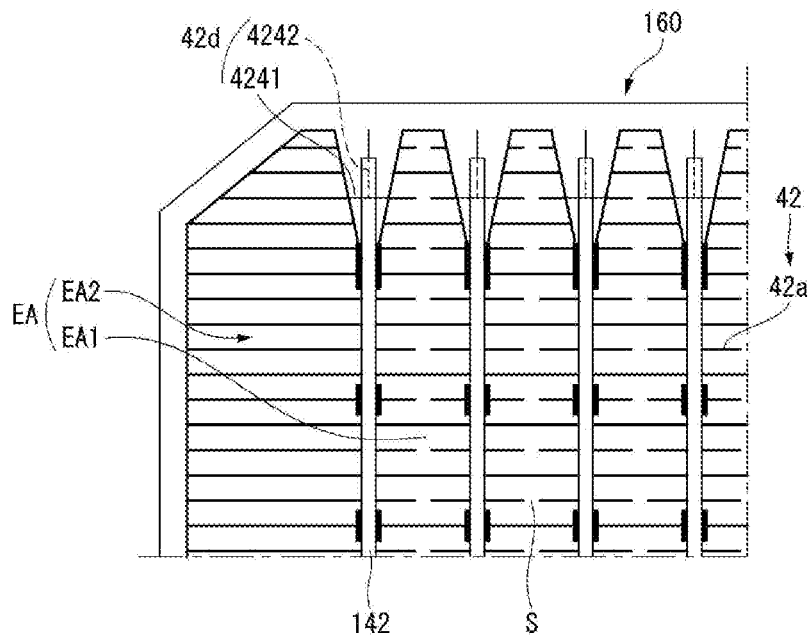
FIG. 8 is a partial front plan view of a solar cell and leads included in a solar cell panel according to another embodiment of the invention.

FIG. 8 is a partial front plan view of a solar cell and leads included in a solar cell panel according to another embodiment of the invention. In FIG. 8, a semiconductor substrate 160, a first electrode 42, and a lead 142 are mainly shown for simplicity and clarity.

Referring to FIG. 8, at least a part of finger lines 42a arranged between two neighboring bus bars 42b may include disconnected portions S where a part of the finger line 42a is removed and thus the finger line 42a does not continuously extend.

In this instance, the disconnected portions S may be formed at the finger lines 42a arranged in the first electrode areas EA1, respectively, and may not be formed at the finger lines 42a arranged in the second electrode areas EA2. Although the finger lines 42a in each first electrode area EA1 have respective disconnected portions S, current may smoothly flow through the finger lines 42a because the finger lines 42a are connected to two neighboring bus bars 42b or leads 142 at opposite sides thereof. In this instance, accordingly, it may be possible to reduce the area of the first electrode 42 without obstructing flow of current in the first electrode area EA1 and, as such, manufacturing costs and shading loss may be reduced. On the other hand, the finger lines 42a in each second electrode area EA2 are connected to one bus bar 42b or lead 142 only at one side thereof, and have no disconnected portion S and, as such, current may smoothly flow to the bus bar 42b or lead 142 disposed at one side of the finger lines 42a.

The disconnected portions S of the finger lines 42a in each first electrode area EA1 may be centrally arranged between two neighboring bus bars 42b corresponding to the first electrode area EA1. Accordingly, it may be possible to minimize a current movement path.

The width of each disconnected portion S may be 0.5 times or more the pitch of each finger line 42a, and may be 0.5 times or less the pitch of each bus bar 42b. When the width of each disconnected portion S is less than 0.5 times the pitch of each finger line 42a, effects of the disconnected portion S may be insufficient because the disconnected portion S is too narrow. On the other hand, when the width of each disconnected portion S is greater than 0.5 times the pitch of each bus bar 42b, electrical characteristics may be degraded because the disconnected portion S is too wide. Meanwhile, for example, the width of each disconnected portion S may be greater than the width W6 of each pad section 422 in each bus bar 42b. Within this range, effects of the disconnected portion S may be maximized. Of course, the embodiments of the invention are not limited to the above-described conditions, and the width of each disconnected portion S may have any of various values.

The ratio of the number of finger lines 42a having disconnected portions S in each first electrode area EA1 may be 0.33 to 1 times the total number of finger lines 42a in the first electrode area EA1 when the numbers of the finger lines 42a are measured in a direction parallel to the bus bars 42b. Within this range, effects of the disconnected portion S may be maximized. In this instance, accordingly, it may be possible to minimize the average movement distance of carriers while providing a sufficient number of disconnected portions S. Of course, the embodiments of the invention are not limited to the above-described conditions, and the above-described number ratio may be varied.

Although the disconnected portions S are illustrated in FIG. 8 as being provided at each first electrode area EA1, the invention is not limited thereto. The disconnected portions S may be provided at a part of the plurality of first electrode areas EA1, and may not be provided at the remaining part of the plurality of first electrode areas EA1. It is exemplified that, in the first electrode areas EA1, the finger lines 42a connecting two neighboring lines 42b and the finger lines 42a having the disconnected portions S are alternately arranged one by one in the second direction. Then, the process cost and the light loss can be reduced, also, the current flow path can be optimized. However, the embodiments of the invention are not limited thereto, and thus, the arrangement of the finger lines 42a connecting two neighboring lines 42b and the finger lines 42a having the disconnected portions S may be variously varied. Further, in the drawings and above description, although illustration and description has been given in conjunction with the first electrode 42, the description may be applied to the second electrode 44 in the same manner.

Figure 9:
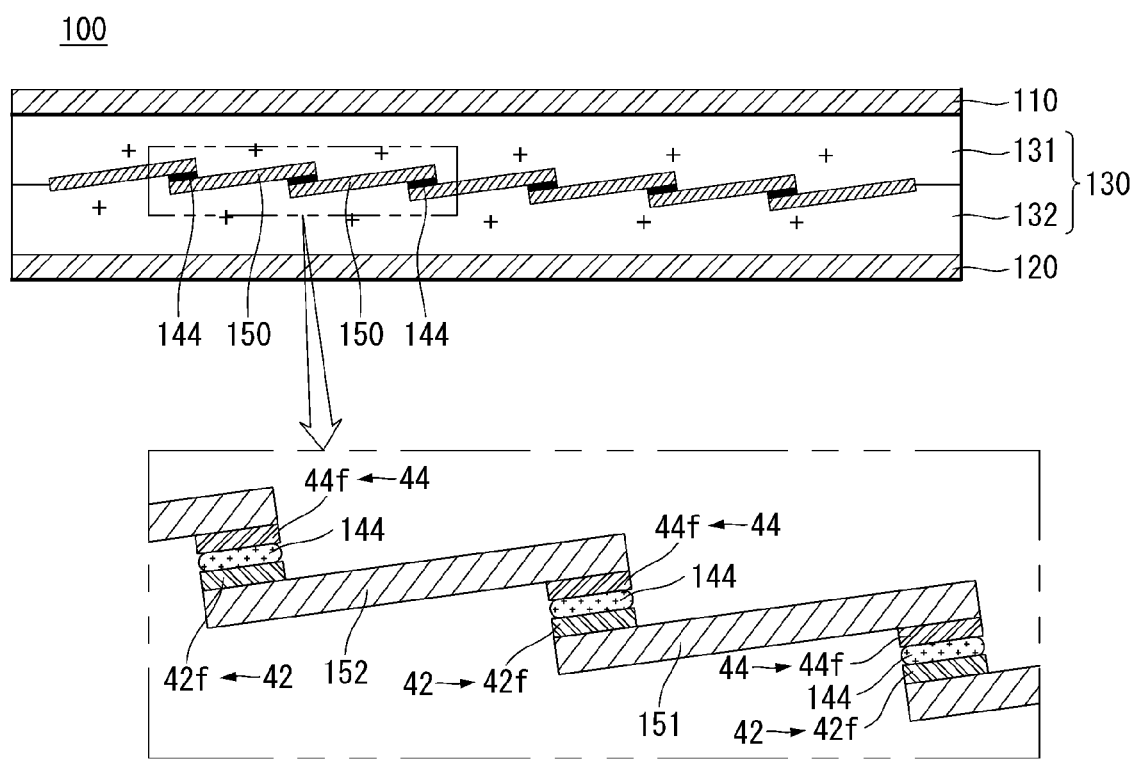
FIG. 9 is a cross-sectional view of a solar cell panel according to yet another embodiment of the invention.
Figure 10:
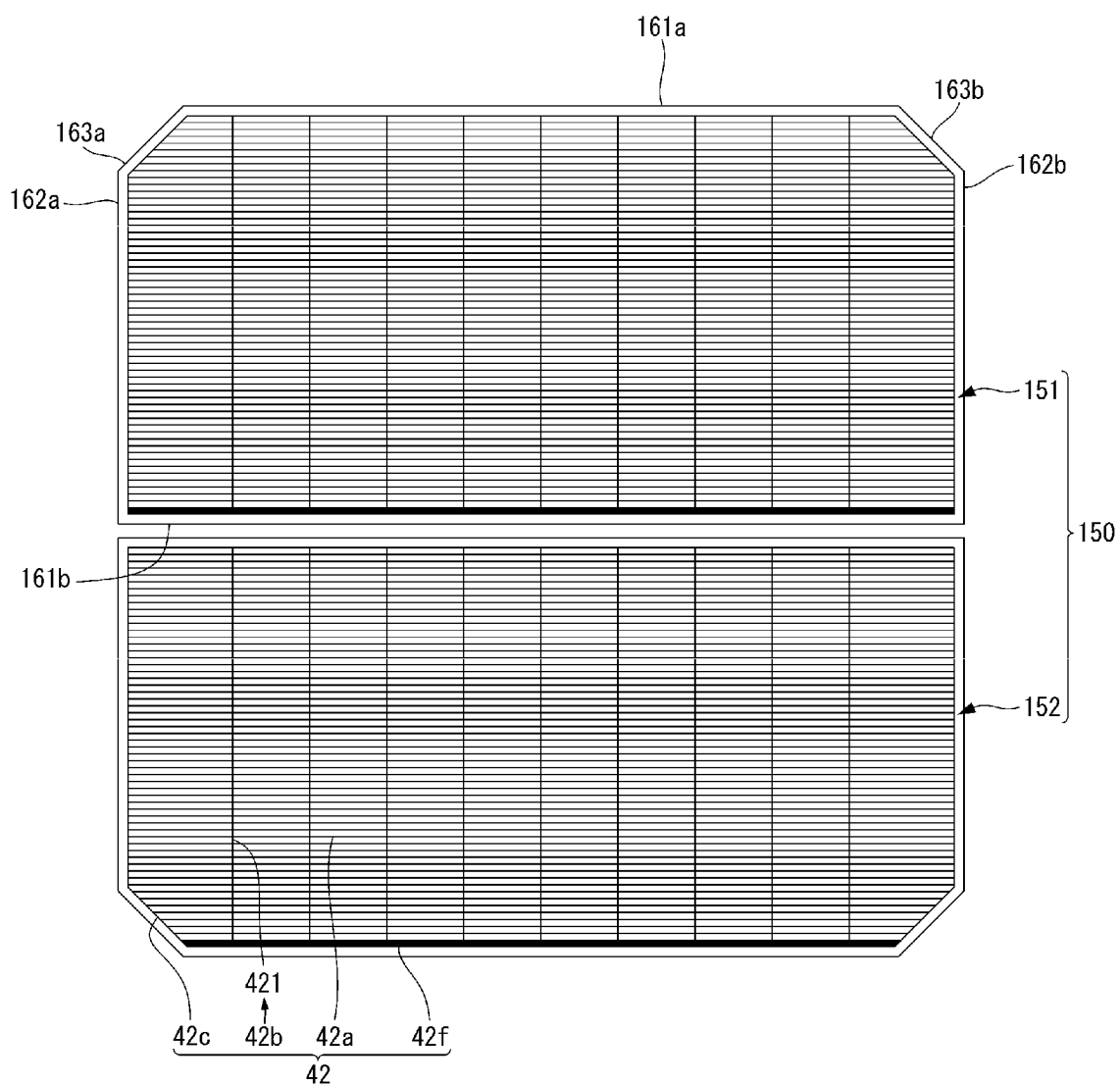
FIG. 10 is a front plan view schematically showing a first solar cell and a second solar cell, which are applicable to the solar cell panel shown in FIG. 9 and manufactured by cutting a mother solar cell.

FIG. 9 is a cross-sectional view of a solar cell panel according to yet another embodiment of the invention. FIG. 10 is a front plan view schematically showing a first solar cell and a second solar cell, which are applicable to the solar cell panel shown in FIG. 9 and manufactured by cutting a mother solar cell.

Referring to FIG. 9, in the embodiment, a plurality of solar cells 150 are connected to each other by a connecting member 144 rather than the lead 142 (see FIG. 1). In this instance, the plurality of solar cells 150 may be electrically connected (e.g., connected in series) to each other by the connecting member 144 to form one row (or string).

More particularly, the connecting member 144 is located between a first electrode 42 of a first solar cell 151 and a second electrode 44 of a second solar cell 152 to electrically and physically connect them. That is, peripheral portions of the first solar cell 151 and the second solar cell 152 are positioned so as to overlap with each other. The connecting member 144 is disposed between a pad electrode 42f of the first electrode 42 of the first solar cell 151, which is positioned at one side (a lower side of FIG. 9), and a pad electrode 44f of the second electrode 44 of the second solar cell 152, which is positioned at the other side (an upper side of FIG. 9) to electrically and physically connect them. For example, the connecting member 144 may be in contact with the pad electrodes 42f and 44f. The connection member 144 may be formed of any of various materials capable of electrically and physically connecting the solar cell 150, for example, a conductive adhesive layer, a solder, or the like. This connection is repeated so that a plurality of solar cells 150 form one row (or string). The solar cell panel 100 may include one or more rows of solar cells 150. When a plurality of columns are provided, various configurations can be applied to the electrical connection for them.

Referring to FIG. 10, in the embodiment, one mother solar cell is cut along a cutting line to manufacture the first and second solar cells 151 and 152, which are a plurality of solar cells 150. The structure of the solar cell 150 described with reference to FIGS. 1 to 8 may be applied as it is to the structure of the solar cell 150 in this embodiment, except for shapes of the first and second electrodes 42 and 44. Hereinafter, the first and second electrodes 42 and 44 included in each solar cell 150 will be described in more detail.

The first electrode 42 located on one surface of the semiconductor substrate 160 may include a plurality of finger lines 42a extending in a first direction (a horizontal direction in FIG. 10) parallel to the long axis and parallel to each other, a bus bar 42b formed in a second direction (a vertical direction in FIG. 10) that crosses (e.g., is perpendicular to) the finger line 42a and electrically connected to the finger lines 42a. In FIG. 10, the first electrode 42 may further include a peripheral line 42c. A width, a pitch, a shape, and the like of the plurality of finger lines 42a, the bus bar 42b, and the peripheral lines 42c described with reference to FIGS. 1 to 8 may be applied to this embodiment.

In the embodiment, the bus bar 42b provides a path for transferring the carriers collected by the finger lines 42a to the pad electrode 42f connected to the connecting member 144. In the embodiment, a number of the bus bars 42b may be sufficiently secured to six or more (e.g., six to thirty-three, more specifically, six to fourteen, for example, six to twelve) to minimize the movement path of the carrier. However, since the connecting member 144 is not directly connected to the bus bar 42b, only the line portion 421 is provided without a pad portion 422 (see FIG. 1), thereby minimizing the shading loss. However, the embodiments of the invention are not limited thereto, and the bus bar 42b may include the pad portion 422.

In the embodiment, the first electrode 42 may include the pad electrode 42f to which the connecting member 144 is connected or attached. The pad electrode 42f is a portion overlapping another solar cell 150 so that the connecting member 144 connecting the neighboring solar cell 150 is directly positioned (e.g., is in direct contact with) on the pad electrode 42f. In this instance, a width of the pad electrode 42f may be larger than a width of the line portion 421 of the finger line 42a and/or a width of the bus bar 42b. Then, the pad electrode 42f and the connecting member 144 are adhered with a sufficient area, and thus, the electrical characteristics and adhesion characteristics can be improved. However, the embodiments of the invention are not limited thereto. Therefore, a width of the pad electrode 42f may be the same as or less than the width of the line portion 421 of the finger line 42a and/or the width of the bus bar 42b. Alternatively, the pad electrode 42f may not be provided, and the connecting member 44 may be in contact with a part of the finger line 42a and/or the bus bar 42b.

The pad electrode 42f is positioned adjacent to the first or second long side 161a and 162a of the solar cell 150 to minimize the area of the solar cell 150 that overlaps the neighboring solar cell 150 while interposing the connecting member 144. The pad electrode 42f has a shape extending in a direction parallel to the first or second long side 161a or 161b (i.e., the first direction parallel to the finger line 42a and crossing the bus bar electrode 42b). Thus, the connection area between the connection member 144 and the pad electrode 42f can be maximized and thus the connection member 144 and the pad electrode 42f can be stably connected to each other.

The pad electrode 42f may be directly connected to a first conductivity type region 20 (see FIG. 1) by penetrating through the insulating layer (e.g., the first passivation layer 22 (see FIG. 1) and the anti-reflection layer 24 (see FIG. 1)) on the first conductivity type region 20, or may be positioned on the insulating layer to be apart from the first conductivity type region 20.

The second electrode 44 located on the other surface of the semiconductor substrate 160 may include a finger line, a bus bar, and a pad electrode 44f corresponding to the finger line 42a, the bus bar 42b, and the pad electrode 42f of the first electrode 42, respectively. Also, the second electrode 44 may further include a peripheral line corresponding to the peripheral line 42c of the first electrode 42. The descriptions of the first electrode 42 may be applied to the second electrode 44, the descriptions of the first passivation layer 22 and the anti-reflection layer 24 related to the first electrode 42 may be applied to the second passivation layer 32 related to the second electrode 44, and the descriptions of the first conductivity type region 20 related to the first electrode 42 may be applied to a second conductivity region 30 related to the second electrode 44. The width, pitch, and the like of the finger lines 42a, the bus bar 42, and the pad electrode 42f of the first electrode 42 may be the same as or different from those of the finger lines, the bus bar, and the pad electrode 44f of the second electrode 44.

In the embodiment, it is exemplified that one pad electrode 42f of the first electrode 42 is provided in each solar cell 150 to be adjacent to one side in the second direction, and one pad electrode 44f of the second electrode 44 is provided in each solar cell 150 to be adjacent to the other side in the second direction. According to this structure, when the unit solar cells 150 are connected, the pad electrode 42f of the first electrode 42 located on the one side of the first solar cell 151 and the pad electrode 44f of the second electrode 44 of the second solar cell 152 located on the other side of the solar cell 152 are adjacent to each other. Thus, the neighboring solar cells 150 can be stably connected only by adjoining the pad electrodes 42f and 44f of the neighboring solar cells 150 using the connecting member 144. In addition, since the pad electrodes 42f and 44f are disposed only on one side, the material cost of the first and second electrodes 42 and 44 can be reduced and the manufacturing process of the first and second electrodes 42 and 44 can be simplified.

Also, in each unit solar cell 150 manufactured from one mother solar cell, the pad electrode 42f of the first electrode 42 is adjacent to one edge (a lower edge in FIG. 10) of the solar cell 150 in the second direction, and the pad electrode 44f of the second electrode 44 is adjacent to the other edge (e.g., an upper edge in FIG. 10) of the solar cell 150 in the second direction. Accordingly, when the plurality of solar cells 150 are connected in series to form the solar cell panel 100, a plurality of solar cells 150 can be connected without changing the arrangement of the solar cells 150. Thus, the manufacturing process of the solar cell panel 100 can be simplified. However, the embodiments of the invention are not limited thereto.

For example, when the first and second solar cells 151 and 152 are formed from one mother solar cell, the pad electrodes 42f of the first electrode 42 included in the first and second solar cells 151 and 152 are adjacent to different long sides and the pad electrodes 44f of the second electrodes 44 included in the first and second solar cells 151 and 152 are adjacent to different long sides. For example, the pad electrode 42f of the first electrode 42 is adjacent to the second long side 161b in the first solar cell 151, and the pad electrode 42f of the first electrode 42 is adjacent to the first long side 161a in the second solar cell 152. Also, the pad electrode 44f of the second electrode 44 is adjacent to the first long side 161a in the first solar cell 151, and the pad electrode 44f of the second electrode 44 is adjacent to the second long side 161b in the second solar cell 152. When the first and second solar cells 151 and 152 having the above structure are connected by using the connection member 144, the pad electrode 42f of the first electrode 42 adjacent to the first long side 161a of the first solar cell 151 is connected to the pad electrode 44f of the second electrode 44 adjacent to the first long side 161a of the second solar cell 152. Accordingly, the long sides having the same length can be connected to each other, and thus, the first and second solar cells 151 and 152 can be stably connected.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell panel, comprising:
   a plurality of solar cells; and
   a plurality of wires that electrically interconnect adjacent solar cells among the plurality of solar cells, with each of the plurality of wires having a rounded cross-section,
   wherein each of the plurality of solar cells comprises:
      a semiconductor substrate that is rectangular-shaped having at least one long side and at least one short side,
      a first electrode, and
      a second electrode,
   wherein the first electrode comprises:
      a plurality of finger electrodes arranged lengthwise along a first direction parallel to the at least one long side of the semiconductor substrate, and
      a plurality of bus electrodes comprising a plurality of contact pads that are arranged along a second direction parallel to the at least one short side of the semiconductor substrate, the second direction being different from the first direction,
   wherein the plurality of wires extend lengthwise along the second direction and are soldered to the plurality of contact pads,
   wherein the plurality of contact pads are spaced apart from one another in the second direction to thereby define a space between neighboring two contact pads among the plurality of contact pads,
   wherein the at least one long side includes a first long side and a second long side that is spaced apart from the first long side in the second direction,
   wherein the semiconductor substrate comprises an edge area that is located at an edge portion of the semiconductor substrate, at least one of the plurality of wires being located at the edge area,
   wherein the edge area comprises:
      a first edge area at which one of the plurality of wires is located, the first edge area being disposed adjacent to the first long side, and
      a second edge area disposed adjacent to the second long side in the second direction,
   wherein a density of the first electrode in each of the first and second edge areas is less than a density of the plurality of finger electrodes in another area of the semiconductor substrate,
   wherein the plurality of contact pads comprise a first outer pad that faces the first edge area, a second outer pad that faces the second edge area, and a plurality of inner pads disposed between the first outer pad and the second outer pad in the second direction,
   wherein the first edge area separates the first outer pad from the edge portion of the semiconductor substrate in the second direction such that one of the plurality of wires is attached to the first electrode,
   wherein at least one of the plurality of finger electrodes is arranged between two adjacent inner pads among the plurality of inner pads,
   wherein a first length of the first or second outer pad in the second direction is greater than a second length of one of the plurality of inner pads in the second direction,
   wherein the first electrode further comprises a peripheral portion that extends from an end of one of the bus electrodes or first outer pad to an end of an outermost finger electrode proximate the edge portion of the semiconductor substrate,
   wherein the first electrode further comprises an edge electrode portion that is disposed at the first edge area or the second edge area, that is connected to one end of the plurality of wires, and that is connected to the plurality of finger electrodes, and
   wherein the edge electrode portion comprises:
      a first electrode portion that is disposed inward in the second direction relative to the outermost finger electrode among the plurality of finger electrodes, wherein the first electrode portion extends in the first direction parallel to the first long side or the second long side, wherein the first electrode portion physically and electrically contacts the peripheral portion or one of the finger electrodes, and wherein the first electrode portion is arranged between the end of one of the bus electrodes and the edge portion of the semiconductor substrate, and
      a second electrode portion that physically and electrically contacts the first electrode portion, wherein the second electrode portion extends in the second direction toward the first long side or the second long side, and wherein the second electrode portion is arranged between the first electrode portion and the edge portion of the semiconductor substrate, and
   wherein the at least one of the plurality of wires located at the edge area overlaps with the second electrode portion, and wherein the at least one of the plurality of wires located at the edge area physically and electrically contacts the second electrode portion.

2. The solar cell panel of claim 1, wherein each of the plurality of bus electrodes comprises a line portion that connects adjacent contact pads among the plurality of contact pads.

3. The solar cell panel of claim 1, wherein the semiconductor substrate further comprises a plurality of electrode areas that are arranged along the first direction, each of the plurality of electrode areas extending along the second direction toward the edge area,
wherein the plurality of finger electrodes extend along the first direction across the plurality of electrodes areas,
wherein the first edge area extends inward in the second direction from the second edge area to thereby separate end portions of the plurality of electrode areas in the first direction, and
wherein each of the plurality of contact pads is disposed between and overlaps with the plurality of electrode areas.

4. The solar cell panel of claim 1, wherein the at least one of the plurality of wires located at the edge area overlaps with the first electrode portion, and wherein the at least one of the plurality of wires located at the edge area physically and electrically contacts the first electrode portion.

5. The solar cell panel of claim 1, wherein a width or diameter of each of the plurality of wires is 250 um to 500 um.

6. The solar cell panel of claim 5, wherein a width of each of the plurality of bus electrodes in the first direction is less than a width of each of the plurality of wires in the first direction.

7. The solar cell panel of claim 1, wherein the second electrode comprises (i) a plurality of finger electrodes that are parallel to the long side of the semiconductor substrate, and (ii) a plurality of bus electrodes that are parallel to the short side of the semiconductor substrate.

8. The solar cell panel of claim 7, wherein the plurality of bus electrodes of the second electrode comprise a plurality of contact pads.

9. The solar cell panel of claim 8, wherein a number of the plurality of contact pads of the second electrode is different from a number of the plurality of contact pads of the first electrode.

10. A solar cell panel, comprising:
a plurality of solar cells; and
a plurality of wires that electrically interconnect adjacent solar cells among the plurality of solar cells,
wherein each of the plurality of solar cells comprises:
a semiconductor substrate that is rectangular-shaped having at least one long side and at least one short side, and
a first electrode comprising:
a plurality of finger electrodes arranged lengthwise along a first direction parallel to the at least one long side of the semiconductor substrate, and
a plurality of bus electrodes comprising a plurality of contact pads that are arranged along a second direction parallel to the at least one short side of the semiconductor substrate, the plurality of contact pads being soldered to the plurality of wires,
wherein the semiconductor substrate comprises an edge area that is located at an edge portion of the semiconductor substrate, wherein the plurality of contact pads comprise a first outer pad that faces the edge area, wherein the first electrode further comprises a peripheral portion that extends from an end of one of the bus electrodes or the first outer pad to an end of an outermost finger electrode proximate the edge portion of the semiconductor substrate,
wherein the first electrode further comprises an edge electrode portion that is disposed at the edge area, that is connected to one end of the plurality of wires, and that is connected to the plurality of finger electrodes, and
wherein the edge electrode portion comprises:
a first electrode portion that is disposed inward in the second direction relative to the outermost finger electrode among the plurality of finger electrodes, wherein the first electrode portion extends in the first direction, wherein the first electrode portion physically and electrically contacts the peripheral portion or one of the finger electrodes, and wherein the first electrode portion is arranged between the end of one of the bus electrodes and the edge portion of the semiconductor substrate, and
a second electrode portion that physically and electrically contacts the first electrode portion, wherein the second electrode portion extends in the second direction toward the long side, wherein the second electrode portion is arranged between the first electrode portion and the edge portion of the semiconductor substrate, and wherein the second electrode portion physically and electrically contacts the one end of the plurality of wires.

11. The solar cell panel of claim 10, wherein an end of the second electrode portion opposite to the first electrode portion is arranged at a first distance from the long side of the semiconductor substrate, wherein the end of the outermost finger electrode is arranged at a second distance from the long side of the semiconductor substrate, wherein the first and second distances are measured in the second direction, and wherein the first distance is about equal to the second distance.

12. The solar cell panel of claim 10, wherein the one end of the plurality of wires directly overlies the second electrode portion.

13. A solar cell panel, comprising:
a plurality of solar cells; and
a plurality of wires that electrically interconnect adjacent solar cells among the plurality of solar cells,
wherein each of the plurality of solar cells comprises:
a semiconductor substrate, and
a first electrode comprising:
a plurality of finger electrodes arranged lengthwise along a first direction, and
a plurality of bus electrodes comprising a plurality of contact pads that are arranged along a second direction different than the first direction, the plurality of contact pads being soldered to the plurality of wires,
wherein the semiconductor substrate comprises an edge area that is located at an edge portion of the semiconductor substrate, wherein the plurality of contact pads comprise a first outer pad that faces the edge area,
wherein the first electrode further comprises an edge electrode portion that is disposed at the edge area, that is connected to one end of the plurality of wires, and that is connected to the plurality of finger electrodes, and
wherein the edge electrode portion comprises:

a first electrode portion that is disposed inward in the second direction relative to the outermost finger electrode among the plurality of finger electrodes, wherein the first electrode portion extends in the first direction, physically and electrically contacts one of the finger electrodes, and wherein the first electrode portion is arranged between the end of one of the bus electrodes and the edge portion of the semiconductor substrate, and a second electrode portion that physically and electrically contacts the first electrode portion, wherein the second electrode portion extends in the second direction, wherein the second electrode portion is arranged between the first electrode portion and the edge portion of the semiconductor substrate, and wherein the second electrode portion physically and electrically contacts the one end of the plurality of wires.

14. The solar cell panel of claim 13, wherein an end of the second electrode portion opposite to the first electrode portion is arranged at a first distance from a first side of the semiconductor substrate parallel to the first direction, wherein an end of the outermost finger electrode is arranged at a second distance from the first side of the semiconductor substrate parallel to the first direction, wherein the first and second distances are measured in the second direction, and wherein the first distance is about equal to the second distance.

15. The solar cell panel of claim 13, wherein an end of the second electrode portion opposite to the first electrode portion is arranged at a first distance from a first side of the semiconductor substrate parallel to the first direction, wherein an end of the outermost finger electrode is arranged at a second distance from the first side of the semiconductor substrate parallel to the first direction, wherein the first and second distances are measured in the second direction, and wherein the first distance is less than the second distance.

16. The solar cell panel of claim 13, wherein the one end of the plurality of wires directly overlies the second electrode portion.

* * * * *